United States Patent [19]
Okamura

[11] Patent Number: 5,892,415
[45] Date of Patent: Apr. 6, 1999

[54] LAMINATED RESONATOR AND LAMINATED BAND PASS FILTER USING SAME

[75] Inventor: Hisatake Okamura, Takefu, Japan

[73] Assignee: Murata Manufacturing Co., Ltd., Nagaokakyto, Japan

[21] Appl. No.: 749,893

[22] Filed: Nov. 18, 1996

[30] Foreign Application Priority Data

Nov. 20, 1995 [JP] Japan .................................. 7-301831
Nov. 20, 1995 [JP] Japan .................................. 7-301832

[51] Int. Cl.$^6$ ...................................................... H03H 7/01
[52] U.S. Cl. ............................................ 333/175; 333/185
[58] Field of Search .................................... 333/184, 185, 333/204, 175

[56] References Cited

U.S. PATENT DOCUMENTS 5,404,118  4/1995  Okamura et al. .................... 333/185 X
5,448,209  9/1995  Hirai et al. ............................. 333/204
5,612,656  3/1997  Sakamoto et al. .................... 333/185 X

FOREIGN PATENT DOCUMENTS 5335804  12/1993  Japan ..................................... 333/204
6-283903  10/1994  Japan .
7-263911  10/1995  Japan .

*Primary Examiner*—Robert J. Pascal
*Assistant Examiner*—Justin P. Bettendorf
*Attorney, Agent, or Firm*—Burns, Doane, Swecker & Mathis, LLP

[57] ABSTRACT

Dielectric sheets 2 having internal electrodes 4 and 5 formed on the respective surfaces thereof, a dielectric sheet 2 having an outgoing electrode 6 formed on the surface thereof, and a dielectric sheet 2 having a shielded electrode 3 formed on the surface thereof are piled and integrally sintered to form a lamination. Grounding external electrodes are formed on first and second opposite sides of this lamination, respectively, and an input/output external electrode is formed on a third side thereof. An end portion 4a of the internal electrode 4 and an end portion 3a of the shielded electrode 3 are connected to the grounding external electrode on the first side. An end portion 5a of the internal electrode 5 and an end portion 3b of the shielded electrode 3 are connected to the grounding external electrode on the second opposite side. An end portion 6a of the outgoing electrode 6 is connected to the input/output external electrode on the third side. The end portion 6b of the outgoing electrode 6 is capacitance-coupled with the adjacent internal electrode 5.

25 Claims, 35 Drawing Sheets

LAMINATED RESONATOR AND LAMINATED BAND PASS FILTER USING SAME

BACKGROUND OF THE INVENTION

1. Field of the Invention

The present invention relates to a resonator and a band pass filter using the same, and more particularly, to a laminated resonator and a laminated band pass filter using the same, used in a portable telephone set.

2. Description of the Related Art

A conventional resonator as shown in FIG. 16, includes a dielectric substrate 192 having a conductor 93 over the entire back thereof and a strip conductor 94 on the surface thereof. The resonator further comprises another dielectric substrate 192 having a conductor 93 over the entire surface thereof, bonded to the first-mentioned substrate 192 with the strip conductor 94 in between to achieve a laminated structure. Assuming that the length of this strip conductor 94 is L, the central wavelength of the resonator is $\lambda$, and the specific inductive capacitance of the dielectric substrate is $\epsilon$, then the following formula (1) applies:

$$L=(\lambda/4)\times(1/\epsilon)^{1/2} \qquad (1).$$

In the conventional resonator, however, it is difficult to downsize the resonator, because the strip conductor 94 is required to have a length L satisfying the relationship of the formula (1). Further, the strip conductor 94 and other resonator parts are typically configured to satisfy strict dimensional tolerances, thereby rendering the manufacture of the resonator difficult.

Another conventional band pass filter, as shown in FIG. 38, comprises a dielectric substrate 102 having conductor 103 over the entire back thereof, and two strip conductors 104 which are $\lambda/4$ resonators on the surface of the dielectric substrate. The two strip conductors 104 are configured to be separated by a distance (D) of about $\lambda/4$. The band pass filter further comprises another dielectric substrate 102 having a conductor 103 over the entire surface thereof, bonded to the first dielectric substrate 102 with the strip conductors 104 in between to achieve a laminated structure. Assuming that the length of the strip conductors 104 is L, the central wavelength is $\lambda$, and the specific inductive capacity of the dielectric substrate is $\epsilon$, then the foregoing formula (1) applies.

However, it is difficult to downsize conventional band pass filters, because the strip conductors are required to have a length L satisfying the relationship of the formula (1). Further, configuring the strip conductors 104 and other band pass filter parts in compliance with strict dimensional tolerances renders the manufacture of the band pass filter difficult.

SUMMARY OF THE INVENTION

An object of the present invention is therefore to provide a laminated resonator and a laminated band pass filter using such a laminated resonator, which can be easily downsized and which is easy to manufacture.

To achieve the foregoing and other objects, exemplary embodiments of a laminated resonator according to the present invention comprise:

(a) at least a pair of oppositely arranged internal electrodes;

(b) an outgoing electrode electrically coupled to at least one of the internal electrodes;

(c) a lamination which includes an insulation in combination with the internal electrodes and the outgoing electrode;

(d) a first external electrode, provided on a surface of the lamination, and connected to one of the internal electrodes;

(e) a second external electrode, provided on the surface of the lamination, and connected to another of the internal electrodes; and (f) a third external electrode, provided on the surface of the lamination, and connected to the outgoing electrode.

In accordance with exemplary embodiments of the present invention, a laminated resonator is provided in which the third external electrode is used as an input/output external electrode, and at least one of the first external electrode and the second external electrode is used as a grounding external electrode.

Another exemplary embodiment of the laminated resonator includes electric coupling between said at least one internal electrode and an outgoing electrode, which is at least one of capacitive coupling, inductive coupling and direct coupling. Particularly in the case of capacitive coupling, the outgoing electrode can be arranged between the internal electrodes, or outside the internal electrodes.

In accordance with another exemplary embodiment, a laminated resonator is provided in which a shielded electrode is provided on at least one of an upper and a lower surface of the lamination. This shielded electrode can be connected to at least one of the first and the second external electrodes, or connected to none of these electrodes. The distance between the shielded electrode and a proximate internal electrode can, for example, be at least 300 $\mu$m, or greater.

Exemplary embodiments of the present invention further encompass the use of a laminated band pass filter having at least two resonators, in which each of the resonators has at least a pair of oppositely arranged internal electrodes and an outgoing electrode electrically coupled with at least one of the internal electrodes. The band pass filter further includes a first external electrode connected to at least one of the internal electrodes of each resonator, a second external electrode connected to another of the internal electrodes of each resonator, and third and a fourth external electrodes connected to the respective outgoing electrodes of the resonators. The external electrodes are provided, at least in part, on a surface of a lamination formed by the internal electrodes, the outgoing electrodes and an insulator.

According to another exemplary embodiment of the laminated band pass filter, the third and fourth external electrodes are used as input/output external electrodes, and at least one of the first and the second external electrodes is used as a grounding external electrode.

Another exemplary embodiment of the laminated band pass filter includes, for each of the plural resonators, electric coupling between the internal electrode and the outgoing electrode which is at least one of capacitive coupling, inductive coupling and direct coupling. Particularly in case of capacitive coupling, the outgoing electrode can be provided between the internal electrodes or outside the internal electrodes.

In accordance with another exemplary embodiment, a laminated band pass filter is provided in which a shielded electrode is provided on at least one of an upper and a lower surfaces of the lamination. This shielded electrode can be connected to at least one of the first and the second external electrodes, or connected to none of these electrodes. The distance between the shielded electrode and a proximate internal electrode can, for example, be at least 300 μm, or greater.

Exemplary embodiments of present invention further encompass the use of a laminated band pass filter in which the first and the second external electrodes are formed on opposite side surfaces of the lamination, and the internal electrodes extend to the respective opposite surfaces, and are connected to the first and the second external electrodes, respectively.

Exemplary embodiments as described above, form a distribution constant resonator using capacitance generated between the internal electrodes, combined with inductance possessed by the internal electrodes. In accordance with exemplary embodiments, a plurality of distribution constant resonators can be converted into a multiple-stage band pass filter by inductive coupling and capacitive coupling.

DESCRIPTION OF THE PREFERRED EMBODIMENTS

Figure 1:
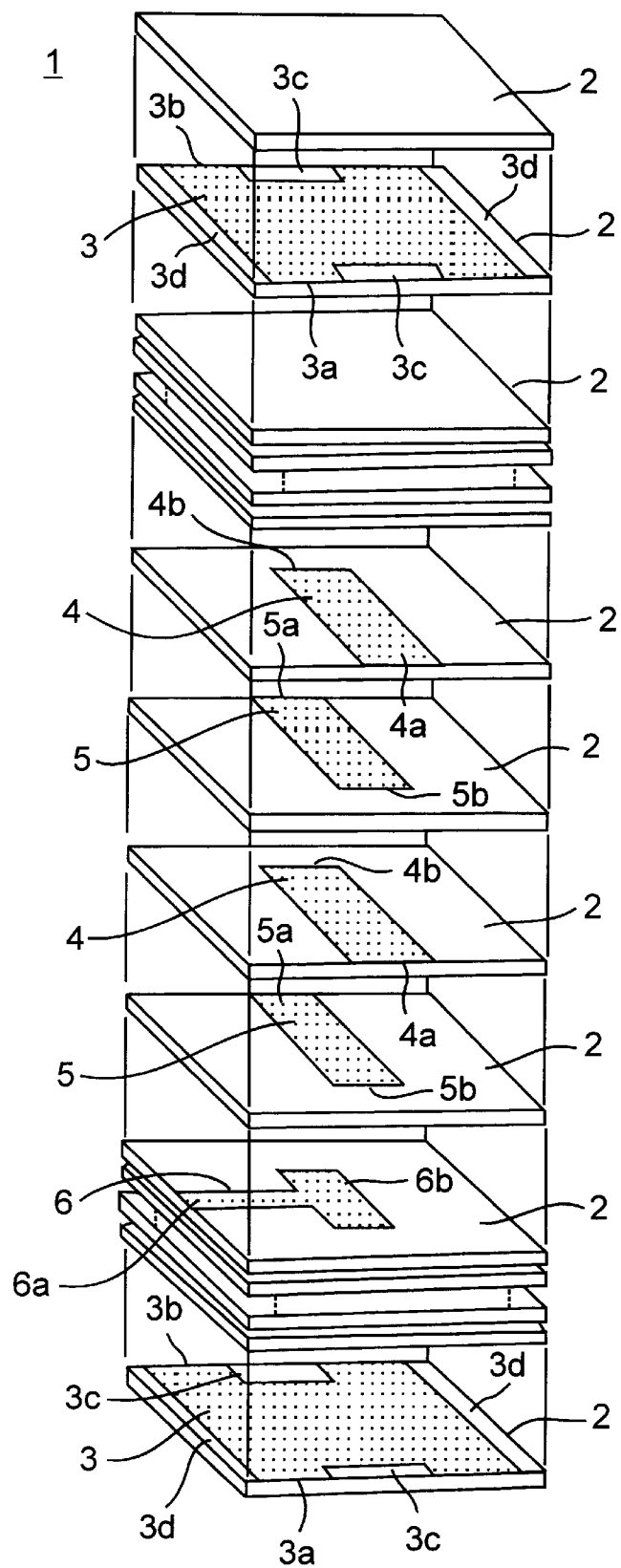
FIG. 1 is an exploded perspective view illustrating a first embodiment of the laminated resonator of the present invention.

Now, embodiments of the laminated resonator of the present invention will be described with reference to the drawings. In the embodiments, the same reference numerals are assigned to the same parts and portions.

Figure 2:
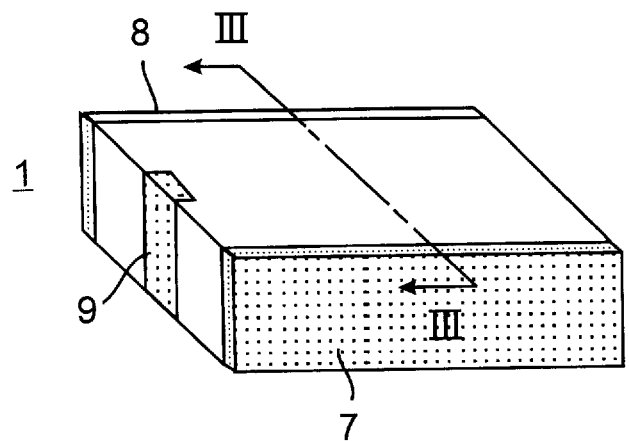
FIG. 2 is a perspective view illustrating the laminated resonator shown in FIG. 1.
Figure 3:
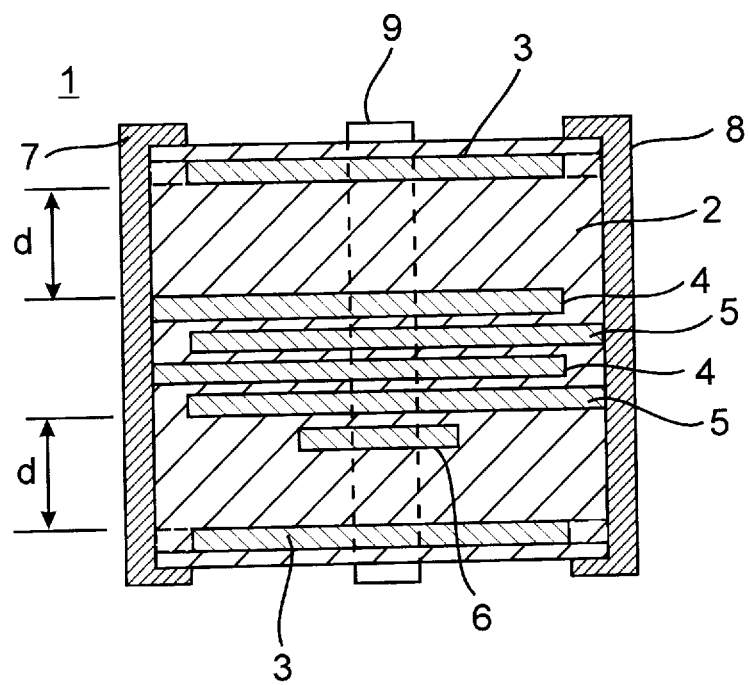
FIG. 3 is a sectional view of the laminated resonator shown in FIG. 2 cut along the line III—III.

First Embodiment (FIGS. 1 to 3)

As shown in FIG. 1, a laminated resonator 1 comprises a dielectric sheet 2 having internal electrodes 4 and 5 on the surface thereof, a dielectric sheet 2 having an outgoing electrode 6 on the surface thereof, a dielectric sheet 2 having a shielded electrode 3 on the surface thereof, and a dielectric sheet 2 having nothing formed on the surface thereof. The dielectric sheet 2 is formed by kneading a mixture of a ceramic powder and a bonding agent, and forming the kneaded mixture into the shape of a sheet. The electrodes 3 to 6 can, for example, comprise Ag, Cu, Au or Ag—Pd, and are formed by such techniques as printing, sputtering or vapor deposition.

The internal electrode 4 is rectangular, and has an end portion 4a exposed on one side of the sheet 2, and the other end portion 4b forming an open end. The internal electrode 5 forms a pair with the internal electrode 4 and is arranged opposite to the internal electrode 4. The internal electrode 5 also has an end portion 5a exposed on one side of the sheet 2, and has another end portion 5b forming an open end. In one exemplary embodiment, the internal electrode 4 is designed to have a width slightly larger than the width of the internal electrode 5. This is to ensure stable manufacture of a resonator of a constant resonance frequency, even upon the occurrence of a shift in laminating the sheet 2, by preventing the facing area between the internal electrodes 4 and 5 from varying. The shape of the internal electrodes 4 and 5 is not limited to a rectangle, but may be circular, triangular, polygonal, or other shape.

The outgoing electrode 6 has an end portion 6a exposed on the left side of the sheet 2, and the other end portion 6b has a large width to provide an increased area. In the laminated state, the end portion 6b is coupled with the internal electrode 5 by capacity coupling. It is not, however, necessary to provide an increased area at the end portion 6b of the outgoing electrode 6. For instance, the outgoing electrode may be strip-shaped with a constant width. Furthermore, it is not necessary to position the outgoing electrode close to the internal electrode 5. For instance, the outgoing electrode may be positioned in the vicinity of the internal electrode 4, or between the internal electrodes 4 and 5.

The shielded electrode 3 is formed over substantially the entire surface of the sheet 2, and has an end portion 3a exposed on one side of the sheet 2, and has another end portion 3b exposed on the opposite side. The bonding strength between layers is improved by providing portions 3c and 3d, which lack the shielded electrode 3 formed on the outer periphery of the sheet 2. The shielded electrode 3 and the sheet 2 are made of different materials, resulting in a low bonding strength. Hence, forming the shielded electrode 3 over the entire surface of the sheet 2 may easily cause peeling or like problems. If there is no risk of peeling, however, the shielding electrode can be formed over the entire surface of the sheet 2.

The sheets 2 which have the construction as described above, are integrally sintered, after piling, into a lamination. Then, grounding external electrodes 7 and 8 (as shown in FIG. 2) are formed on opposite sides of the resultant lamination, and an input/output electrode 9 is formed on the left side (that is, the left side of the graphical depiction shown in FIG. 2). The external electrodes 7 to 9 are formed by such exemplary techniques as coating/baking, sputtering or vapor deposition. The end 4a of the internal electrode 4 and the end 3a of the shielded electrode 3 are connected to the grounding external electrode 7, and the end 5a of the internal electrode 5 and the end 3b of the shielded electrode 3 are connected to the grounding external electrode 8. The end 6a of the outgoing electrode 6 is connected to the input/output external electrode 9. As shown in FIG. 3, the distance d between the shielded electrode 3 and the internal electrodes 4 and 5 can be at least 300 $\mu$m or more. For example, the distance d can be at least 400 $\mu$m, or at least 600 $\mu$m, or even at least 800 $\mu$m. A small distance d causes the generation of an eddy current loss in the shielded electrode 3, leading to attenuation of a magnetic field in the resonator, which results in deterioration of the Q-value of the resonator.

In a laminated resonator 1 described above, capacitance produced between the internal electrodes 4 and 5 and inductance possessed by the internal electrodes 4 and 5 are combined to form a distribution constant resonator. More specifically, since this is a distribution constant type resonator with capacitance as a main factor, without the use of a strip conductor as in a conventional resonator, the central wavelength $\lambda$ is no longer critical, and it is thus possible to downsize the resonator 1. A compact resonator having a high Q-value is thus attainable. Numerically, as compared with a Q-value of 80 for the conventional resonator, the resonator 1 of the first embodiment has an exemplary Q-value of 100.

Furthermore, because it is no longer necessary to manufacture the internal electrodes 4 and 5 with a high degree of dimensional accuracy, and the method of manufacturing a conventional laminated condenser is applicable, it is easier to manufacture the laminated resonator of this embodiment.

Figure 4:
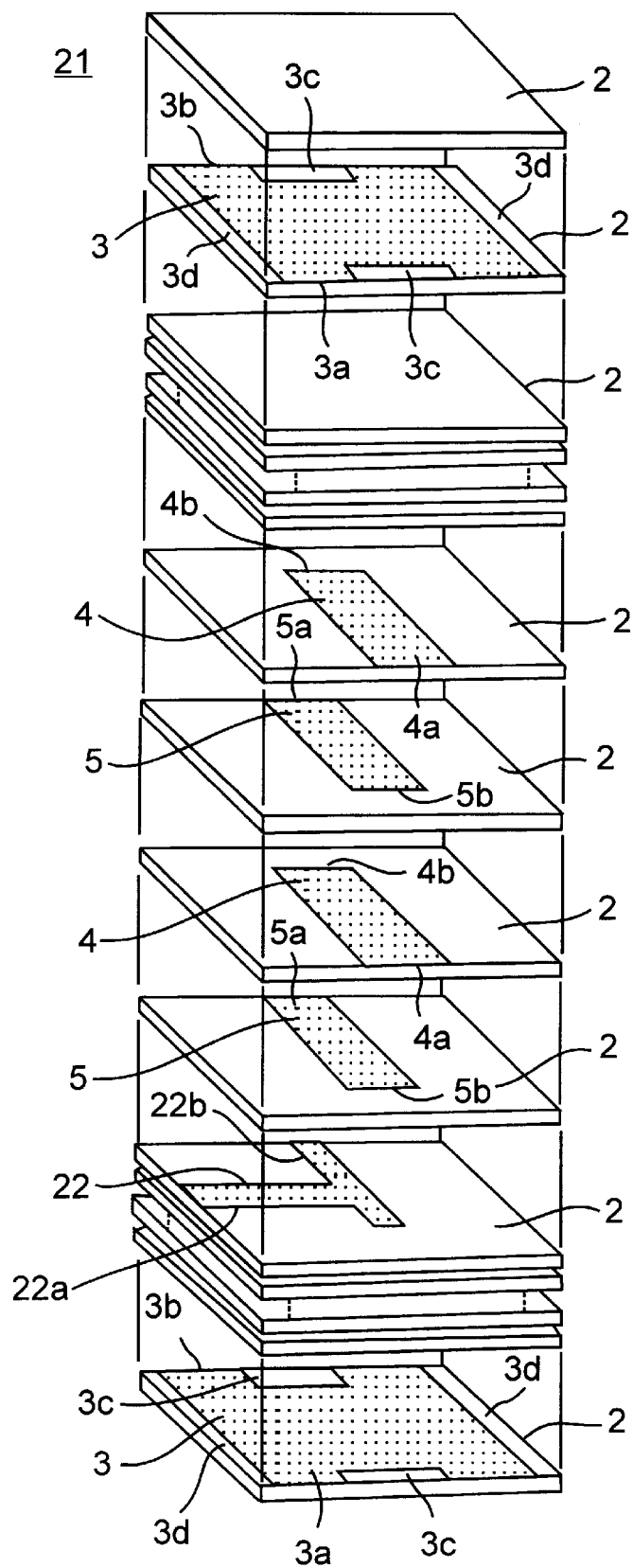
FIG. 4 is an exploded perspective view illustrating a second embodiment of the laminated resonator of the present invention.
Figure 5:
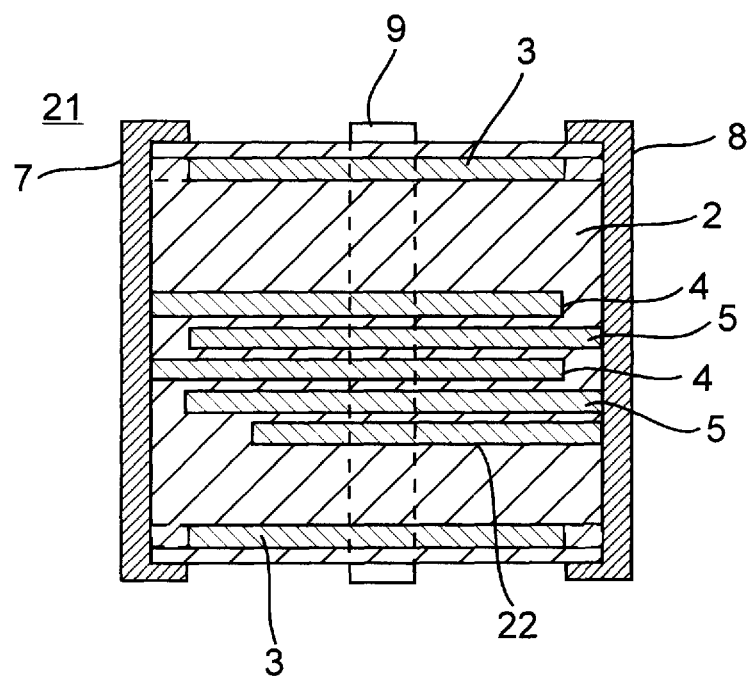
FIG. 5 is a sectional view of the laminated resonator shown in FIG. 4.

Second Embodiment (FIGS. 4 and 5)

As shown in FIG. 4, a laminated resonator 21 has the same construction as the resonator of the foregoing first embodiment, except for an outgoing electrode 22. The outgoing electrode 22 is substantially T-shaped, and has an end portion 22a exposed on the left side of a dielectric sheet 2 and another end portion 22b exposed on another side of the sheet 2. The other end portion 22b in the laminated state is coupled with an internal electrode 5 by inductive coupling.

As shown in FIG. 5, the end portion 22a is connected to an input/output external electrode 9, and the end portion 22b is connected to a grounding external electrode 8. It is not, however, necessary to use a T-shaped outgoing electrode. For instance, the outgoing electrode may be L-shaped. It is also not necessary that the outgoing electrode be arranged proximate to the internal electrode 5. For instance, it may be arranged in the vicinity of the internal electrode 4 or between the internal electrodes 4 and 5. The laminated resonator 21 having the construction as described above functions in a similar manner to the resonator 1 of the above-mentioned first embodiment.

Figure 6:
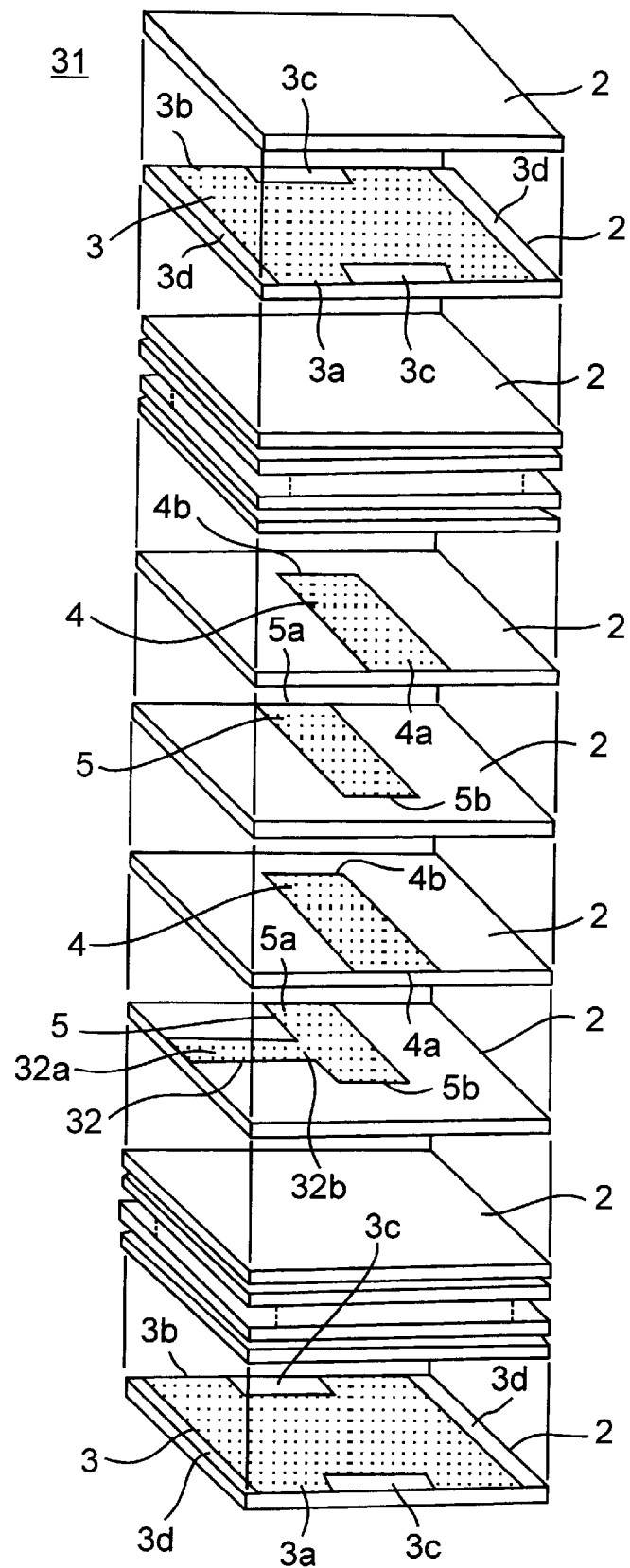
FIG. 6 is an exploded perspective view illustrating a third embodiment of the laminated resonator of the present invention.
Figure 7:
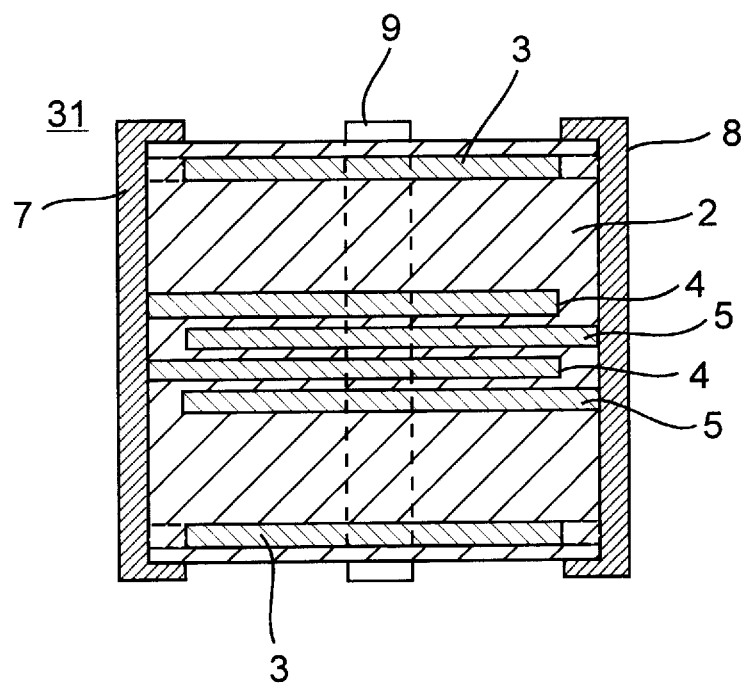
FIG. 7 is a sectional view of the laminated resonator shown in FIG. 6.

Third Embodiment (FIGS. 6 and 7)

As shown in FIGS. 6 and 7, a laminated resonator 31 has the same construction as that of the resonator 1 of the foregoing first embodiment, except for an outgoing electrode 32. The outgoing electrode 32 is formed on a dielectric sheet 2 on which an internal electrode 5 is formed. The outgoing electrode 32 is strip-shaped with a constant width, and has an end portion 32a exposed on the left side of the dielectric sheet 2, and has another end portion 32b connected to the internal electrode 5 so as to form substantially a T shape. Therefore, the outgoing electrode 32 is coupled directly with the internal electrode 5. The end portion 32a is connected to an input/output external electrode 9. It is not necessary, however, to connect the outgoing electrode to the internal electrode 5. For instance, it can be connected to an internal electrode 4. The laminated resonator 31 having the construction as described above has similar functions as the resonator 1 of the above-mentioned first embodiment.

Fourth and Fifth Embodiments (FIGS. 8 to 11)

Figure 8:
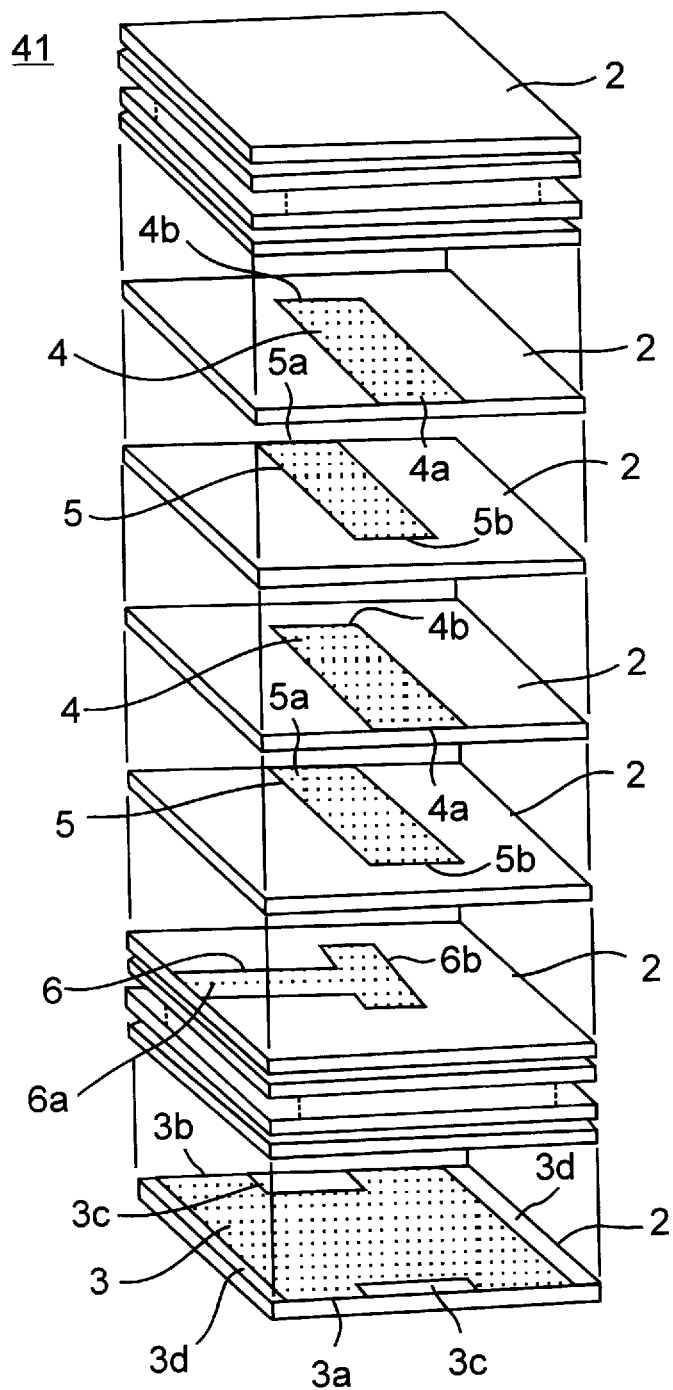
FIG. 8 is an exploded perspective view illustrating a fourth embodiment of the laminated resonator of the present invention.
Figure 9:
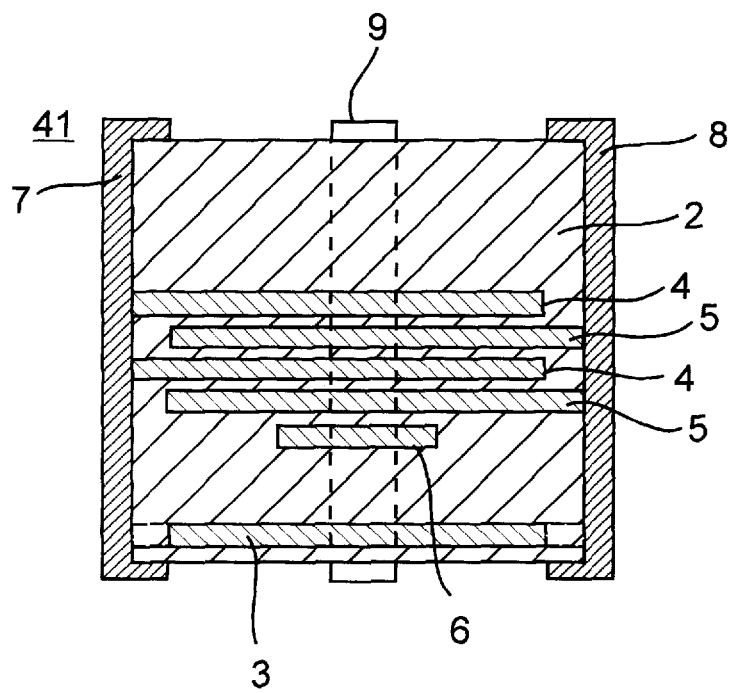
FIG. 9 is a sectional view of the laminated resonator shown in FIG. 8.
Figure 10:
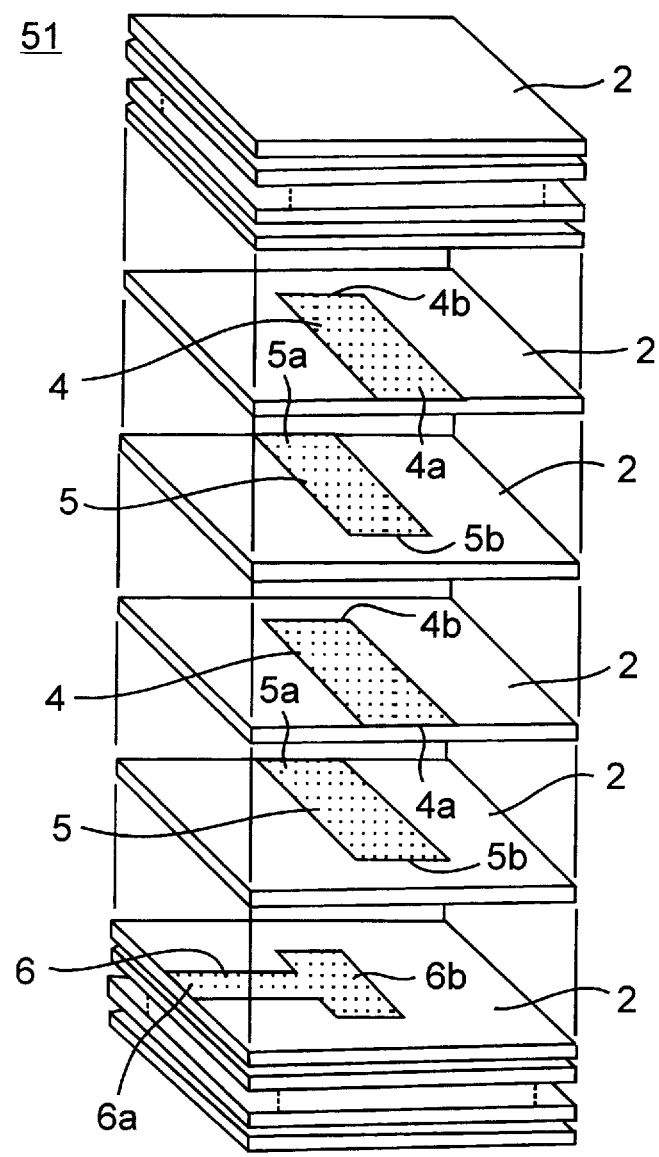
FIG. 10 is an exploded perspective view illustrating a fifth embodiment of the laminated resonator of the present invention.
Figure 11:
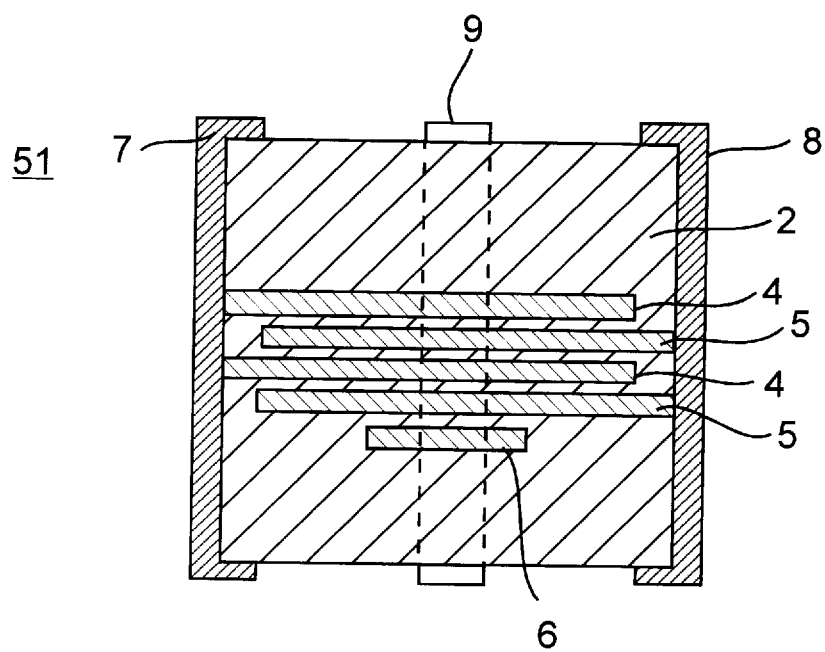
FIG. 11 is a sectional view of the laminated resonator shown in FIG. 10.

As shown in FIGS. 8 and 9, a laminated resonator 41 has the same construction as that of the resonator 1 of the foregoing first embodiment, but excludes the shielded electrode 3 arranged on the upper surface of the resonator 1. As shown in FIGS. 10 and 11, a laminated resonator 51 has the same construction as that of the resonator 1 of the first embodiment, but excludes all the shielded electrodes 3 of the resonator 1. These resonators 41 and 51 have similar functions as the resonator 1 of the foregoing first embodiment. In addition, it is possible to omit the manufacturing steps for forming the shielded electrodes, and thereby achieve a lower manufacturing cost.

In the case of the resonator 41 or 51, the resonator can be shielded by covering the resonator with a shielding metal case after mounting it on a printed circuit board, or by mounting the resonator 41 or 51 by soldering it onto a wide-area shielding ground pattern formed on a printed circuit board.

The principles of the fourth and the fifth embodiments are applicable to the other embodiments described herein as well.

Sixth and Seventh Embodiments (FIGS. 12 to 15)

Figure 12:
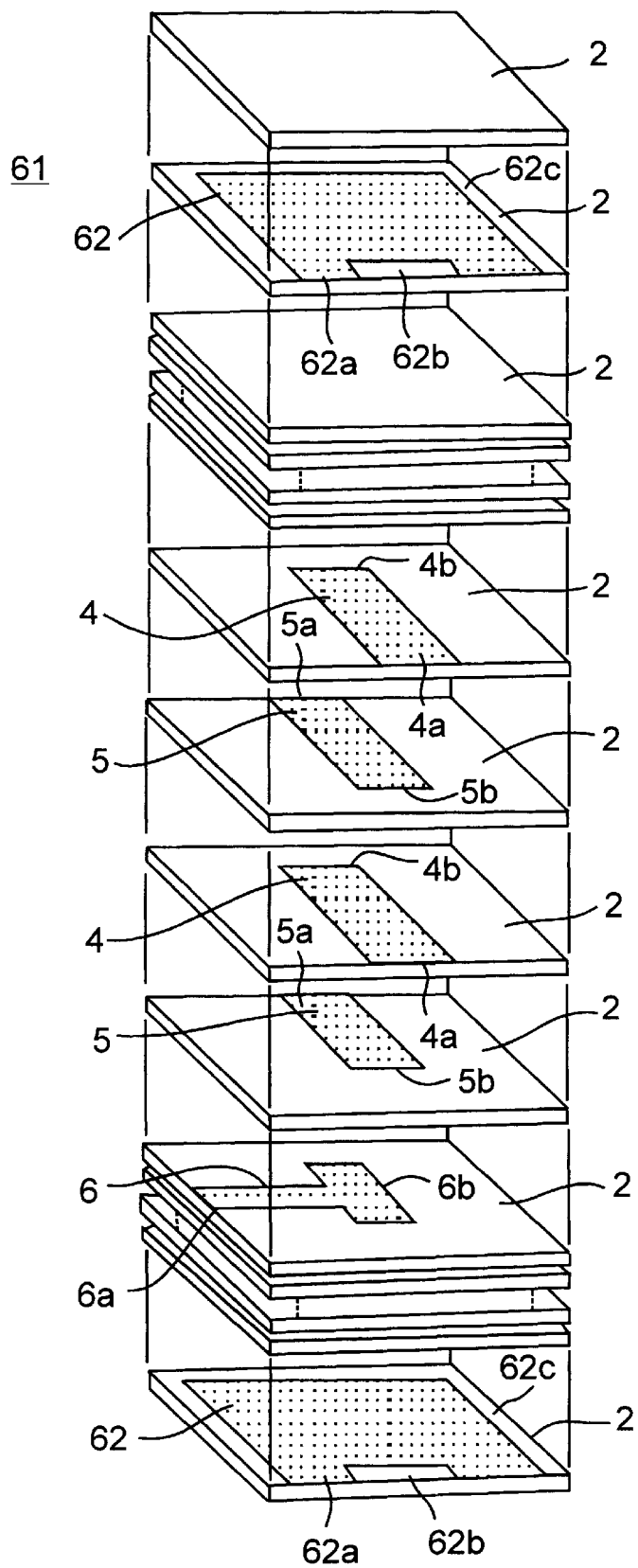
FIG. 12 is an exploded perspective view illustrating a sixth embodiment of the laminated resonator of the present invention.
Figure 13:
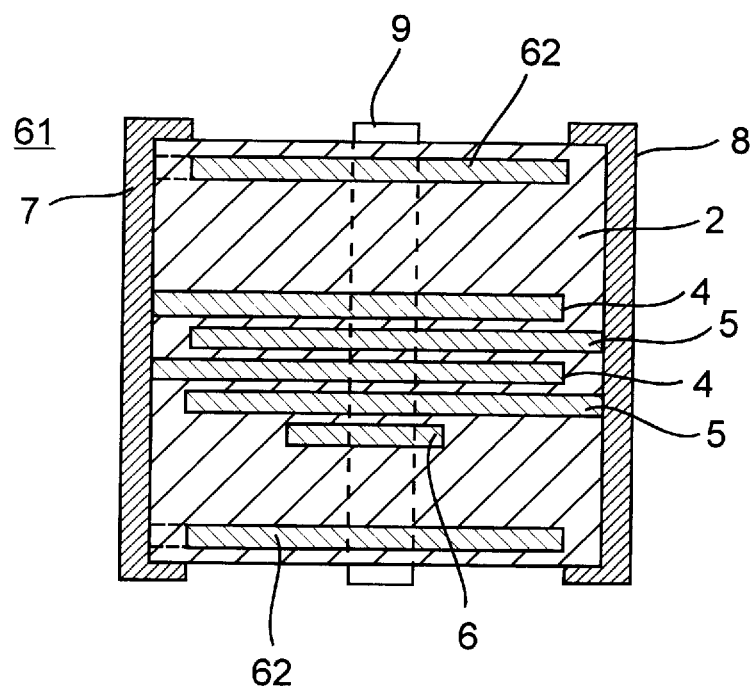
FIG. 13 is a sectional view of the laminated resonator shown in FIG. 12.

As shown in FIGS. 12 and 13, a laminated resonator 61 has the same construction as the resonator 1 of the foregoing first embodiment, except for a shielded electrode 62. The shielded electrode 62 is formed over substantially the entire surface of a dielectric sheet 2, and has an end portion 62a which is exposed on one side of the sheet 2. Bonding strength between layers is improved by providing portions 62b and 62c which do not have the shielded electrode 62 formed thereon on the outer periphery of the sheet 2. The shielded electrode 62 is connected only to the grounding external electrode 7.

Figure 14:
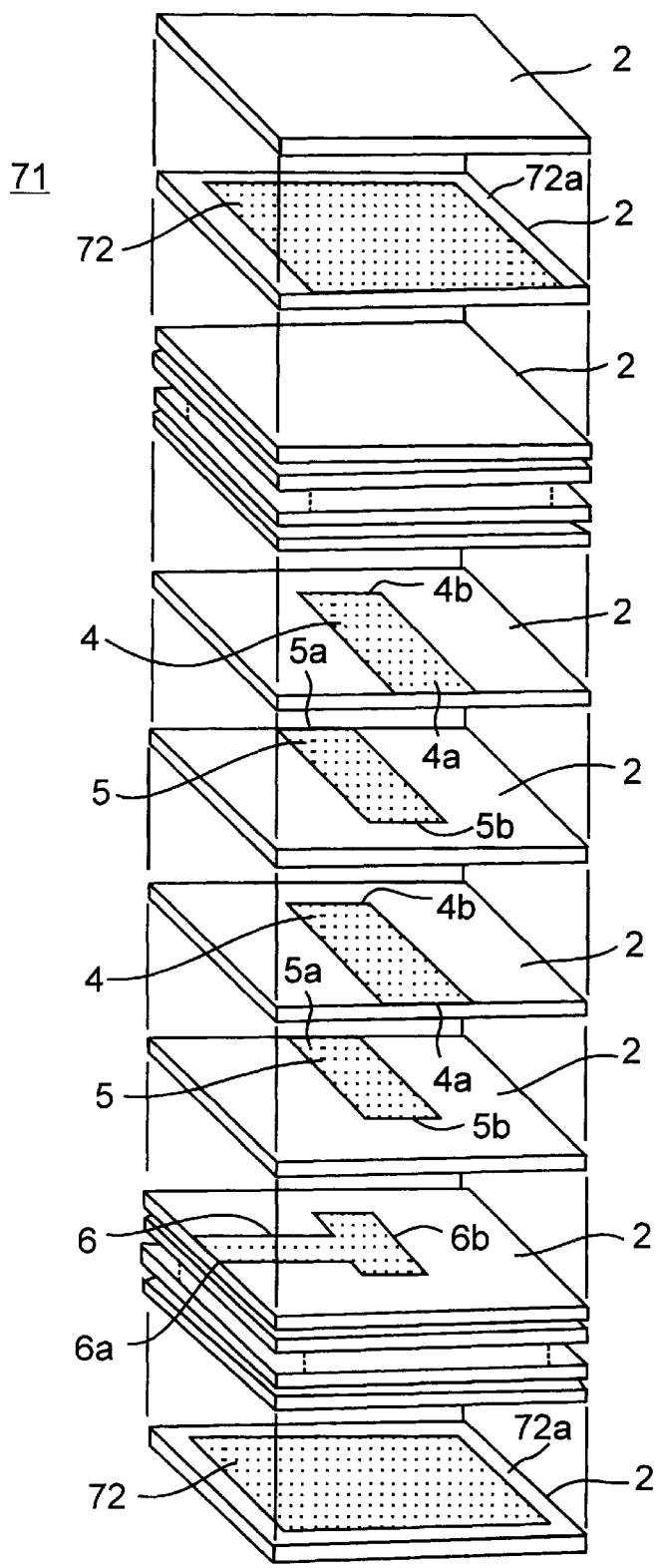
FIG. 14 is an exploded perspective view illustrating a seventh embodiment of the laminated resonator of the present invention.
Figure 15:
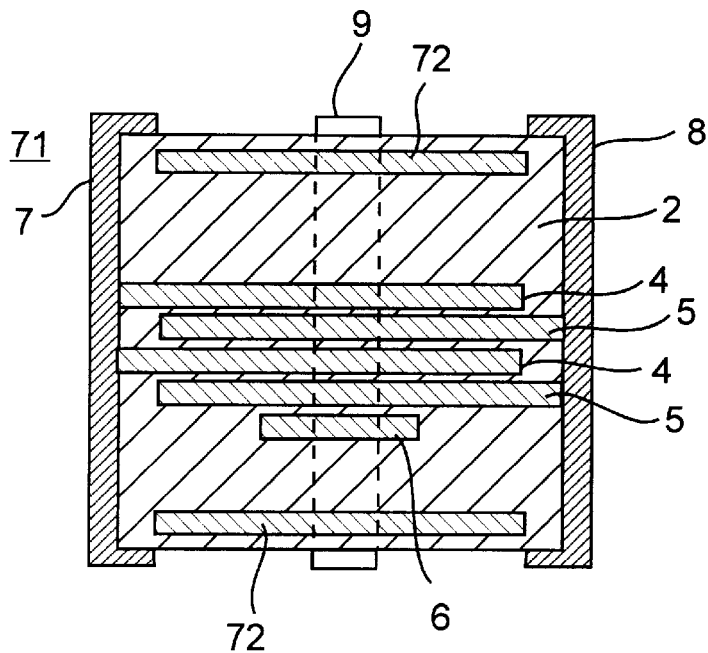
FIG. 15 is a sectional view of the laminated resonator shown in FIG. 14.
Figure 16:
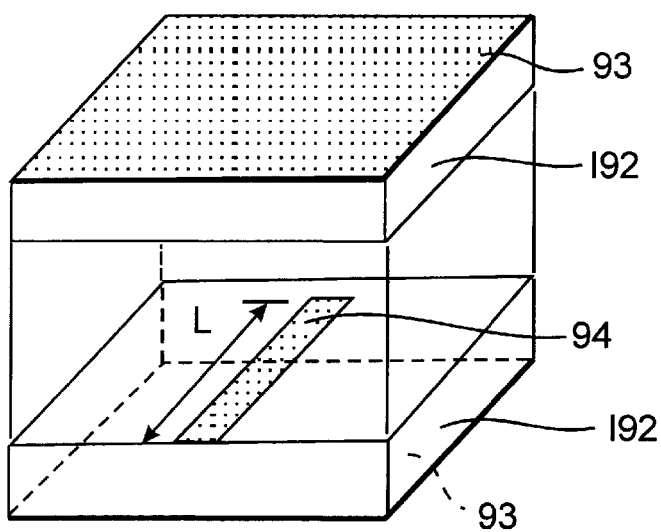
FIG. 16 is an exploded perspective view illustrating a conventional laminated resonator.

As shown in FIGS. 14 and 15, a laminated resonator 71 has the same construction as the resonator 1 of the foregoing first embodiment, except for a shielded electrode 72. The shielded electrode 72 is formed over substantially the entire surface of a dielectric sheet 2. Bonding strength between sheets 2 is improved by providing a portion 72a which does not have the shielded electrode 72 formed thereon on the outer periphery of the sheet 2. The shielded electrode 72 is not connected to any external electrode. The resonators 61 and 71, having the construction as described above, have similar functions as the resonator 1 of the above-mentioned first embodiment, and further provide an improved bonding strength between sheets 2.

The principles of the sixth and the seventh embodiments apply to the other embodiments described herein as well.

Other Embodiments

The laminated resonator of the present invention is not limited to the foregoing embodiments. Many variations are possible, as will be apparent to those skilled in the art.

For instance, the number of internal electrodes is not limited to 4, but can be any number of at least 2 electrodes. With more internal electrodes, the central frequency of the resonator can be reduced, and any resonator in a range from MHz to GHz bands can be freely designed without scaling up the size by adjusting the number of internal electrodes. The resonator of the present invention is therefore widely applicable, not only in communication equipment, but also in television equipment. Distance between internal electrodes can be non-uniform, and can vary in response to particular specifications.

It is not mandatory to provide external electrodes on the sides of the lamination. For instance, the external electrodes may be formed on the surface and the back of the lamination by through use of electric connection means, such as through-holes.

In the foregoing embodiments, the sheets are piled and then integrally sintered, but this is not the only technique for constructing the device. For example, a laminated resonator may be manufactured by the following method. The method comprises applying a dielectric pasty material by printing or like technique, forming a dielectric film by drying, applying a conductive pasty material onto the surface of the resultant dielectric film, and drying the film, thereby forming an electrode film. A resonator having a lamination structure can thus be obtained by conducting lap coating. It is not necessary to use a dielectric material or ceramics for the sheet 2. For instance, a resin film or any other insulator can be used, or a previously sintered ceramic material can be used.

Electric coupling between the internal electrode and the outgoing electrode can be any combination of, for example, capacitance coupling and inductive coupling, or any combination of capacitance coupling, inductive coupling and direct coupling.

Now, embodiments of the laminated band pass filter of the present invention will be described with reference to the drawings. In the embodiments, the same reference numerals are assigned to the same parts and portions.

First Embodiment (FIGS. 17 to 20)

Figure 17:
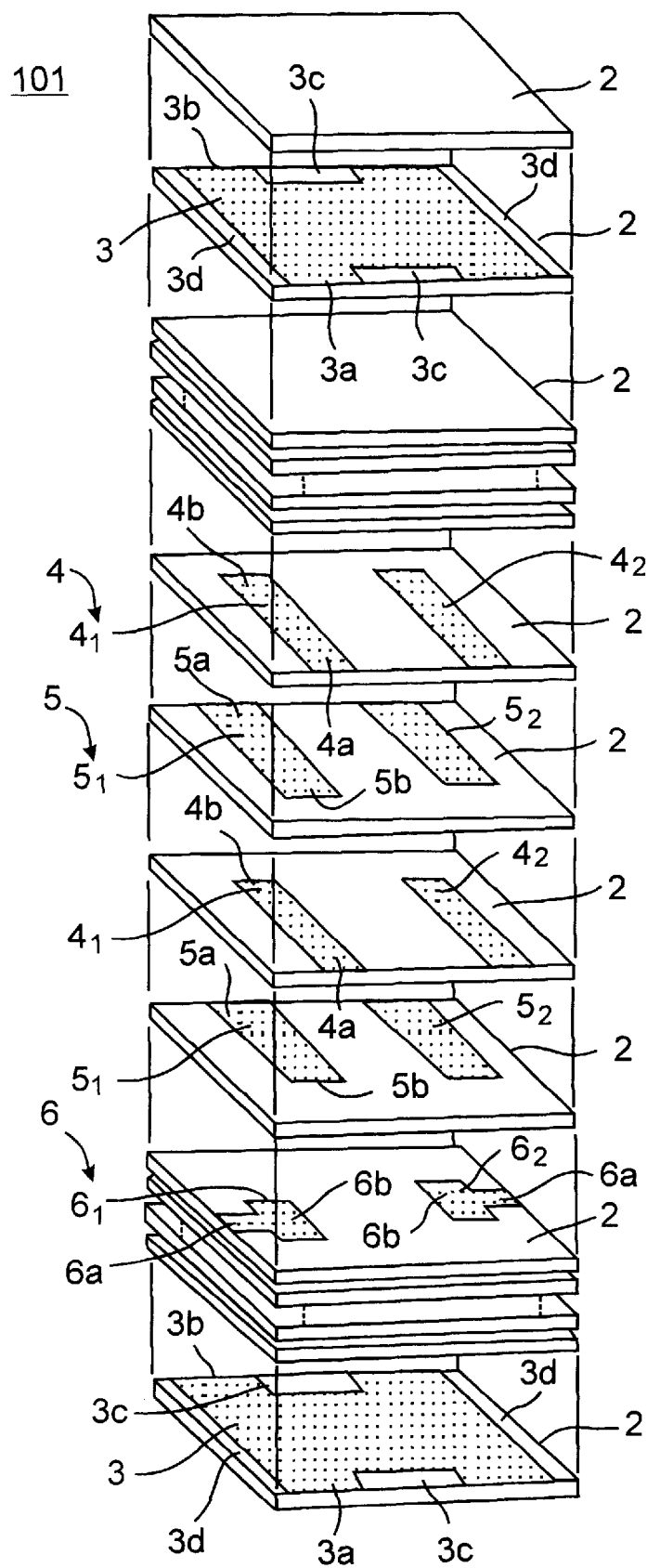
FIG. 17 is an exploded perspective view illustrating a first embodiment of the laminated band pass filter of the present invention.

As shown in FIG. 17, a laminated band pass filter 101 comprises a dielectric sheet 2 having internal electrodes 4 ($4_1$, $4_2$) and 5 ($5_1$, $5_2$) on the surface thereof, a dielectric sheet 2 having outgoing electrodes 6 ($6_1$, $6_2$) on the surface thereof, a dielectric sheet 2 having a shielded electrode 3 on the surface thereof, and a dielectric sheet 2 having nothing formed on the surface thereof. The dielectric sheet 2 is formed by kneading a mixture of a ceramic powder and a bonding agent and forming the kneaded mixture into the shape of a sheet. The electrodes 3 to 6 can comprise, for example, Ag, Cu, Au or Ag—Pd, and are formed by techniques such as printing, sputtering or vapor deposition.

The internal electrode 4 is rectangular, and has an end portion 4a exposed on one side of the sheet 2, and has another end portion 4b forming an open end. The internal electrodes $4_1$ and $4_2$ are designed with similar dimensions and are installed in parallel with each other. The internal electrode $4_1$ is positioned toward the left of the sheet 2, and the internal electrode $4_2$ is positioned toward the right. The internal electrode 5 forming a pair with the internal electrode 4 is rectangular, and is arranged opposite to the internal electrode 4. The internal electrode 5 has an end portion 5a exposed on one side of the sheet 2, and has another end portion 5b forming an open end. The internal electrodes $5_1$ and $5_2$ are designed with similar dimensions and are installed in parallel with each other. The internal electrode $5_1$ is positioned toward the left of the sheet 2, and the internal electrode $5_2$ is positioned toward the right. In one exemplary embodiment, the internal electrode 4 is designed to have a width slightly larger than the width of the internal electrode 5. This is to ensure stable manufacture of a band pass filter of a constant resonance frequency, even upon the occurrence of a shift in laminating the sheet 2, by preventing the facing area between the internal electrodes 4 and 5 from varying. The shape of the internal electrodes 4 and 5 is not limited to a rectangle. For instance, the shape may be circular, triangular, polygonal, or other shape.

The outgoing electrode $6_1$ has an end portion 6a exposed on the left side of the sheet 2, and has another end portion 6b having a large width to provide an increased area. The other end portion 6b is coupled with the internal electrode $5_1$ by capacitance coupling. Similarly, the outgoing electrode $6_2$ is designed having similar dimensions to the outgoing electrode $6_1$. The electrode $6_2$ has an end portion 6a exposed on the right side of the sheet 2, and has another end portion 6b coupled with the internal electrode $5_2$ by capacitance coupling. It is not, however, necessary to provide an increased area at the end portion 6b. Instead, the outgoing electrode can be strip-shaped with a constant width. Furthermore, it is not necessary to position the outgoing electrode close to the internal electrode 5. For instance, the outgoing electrode can be arranged in the vicinity of the internal electrode 4, or between the internal electrodes 4 and 5.

The shielded electrode 3 is formed over substantially the entire surface of the sheet 2, and has an end portion 3a exposed on one side of the sheet 2, and another end portion 3b exposed on the opposite side. The bonding strength between layers is improved by providing portions 3c and 3d which do not have the shielded electrode 3 formed thereon on the outer periphery of the sheet 2. The shielded electrode 3 and the sheet 2 are made of different materials, resulting in a low bonding strength. Hence, forming the shielded electrode 3 over the entire surface of the sheet 2 may cause peeling or similar problems. However, if there is no risk of peeling, the shielded electrode 3 may be formed over the entire surface of the sheet 2.

Figure 18:
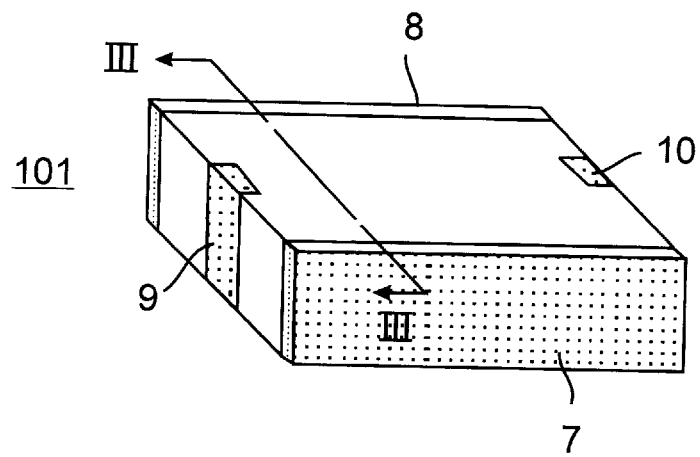
FIG. 18 is a perspective view illustrating the laminated band pass filter shown in FIG. 17.
Figure 19:
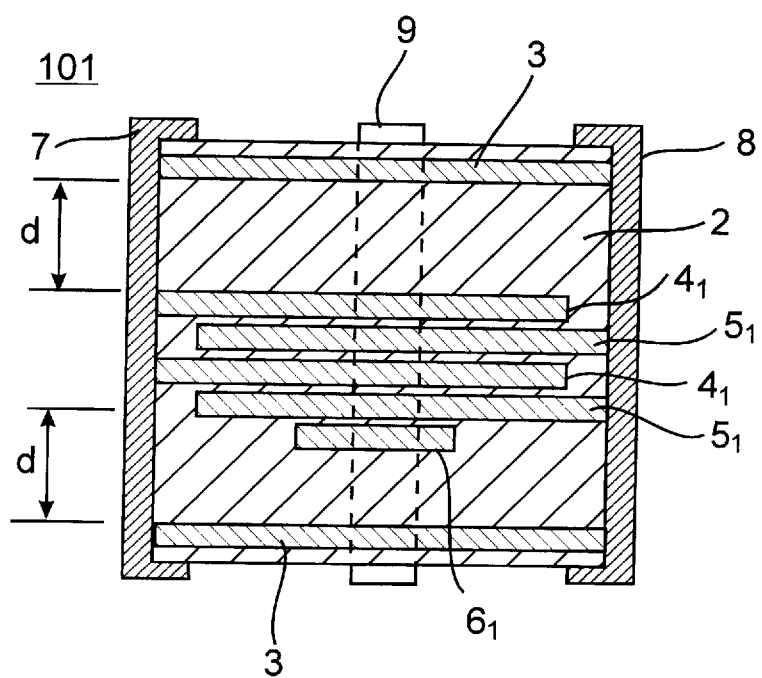
FIG. 19 is a sectional view of the band pass filter shown in FIG. 18 cut along the line III—III.

The sheets 2 having the construction as described above are integrally sintered, after piling, into a lamination. Then, as shown in FIG. 18, grounding external electrodes 7 and 8 are formed on opposite sides of the resultant lamination, respectively, and input/output electrode 9 and 10 are formed on the left and the right sides, respectively. The external electrodes 7 to 10 are formed by such exemplary techniques as coating/baking, sputtering or vapor deposition. The end 4a of the internal electrode 4 and the end 3a of the shielded electrode 3 are connected to the grounding external electrode 7, and the end 5a of the internal electrode 5 and the end 3b of the shielded electrode 3 are connected to the grounding external electrode 8. The end 6a of the outgoing electrode $6_1$ is connected to the input/output external electrode 9. As shown in FIG. 19, the distance d between the shielded electrode 3 and the internal electrodes 4 and 5 can be at least 300 μm, or more. In other embodiments, the distance d can be at least 400 μm, or at least 600 μm, or even at least 800 μm or more. A small distance d causes generation of an eddy current loss in the shielded electrode 3, leading to attenuation of a magnetic field in the resonator, results in deterioration of the Q-value of the resonator.

In a laminated band pass filter 101 thus obtained, capacitance produced between the internal electrodes $4_1$ and $5_1$ and inductance possessed by the internal electrodes $4_1$ and $5_1$ are combined to form a distribution constant resonator. Similarly, capacitance produced between the internal electrodes $4_2$ and $5_2$ and inductance possessed by the internal electrodes $4_2$ and $5_2$ are combined to form a distribution constant resonator. The thus formed two distribution constant resonators are coupled by inductance coupling and capacitance coupling to form a filter known as a two-stage band pass filter. More specifically, since this is a distribution constant band pass filter with capacitance as a main factor, without the use of a strip conductor as in a conventional device, the central wavelength λ is no longer critical, and it is thus possible to downsize the band pass filter 101. A compact band pass filter having slight loss is thus possible. Furthermore, because the dimensional tolerances are less strict for the internal electrodes 4 and 5, and the method of manufacturing a conventional laminated condenser is applicable, it is easier to manufacture the laminated band pass filter.

Figure 20:
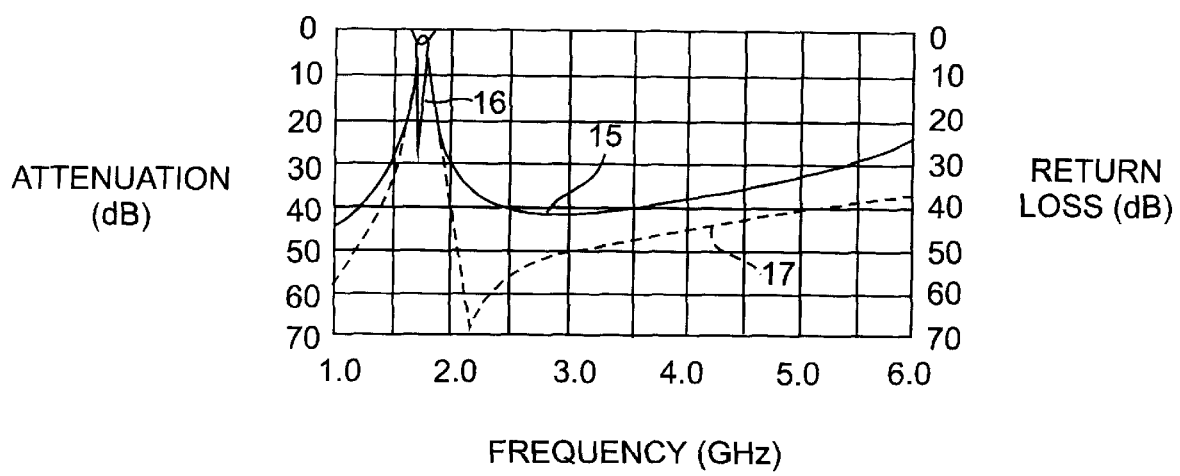
FIG. 20 is a graph illustrating damping and loss characteristics of the filter shown in FIG. 18.

FIG. 20 is a graph illustrating damping characteristics (solid line 15) and reflection characteristics (solid line 16) of the resultant band pass filter. In FIG. 20, the damping characteristics represented by the broken line 17 are that of a filter obtained in a fifth embodiment described later.

Figure 21:
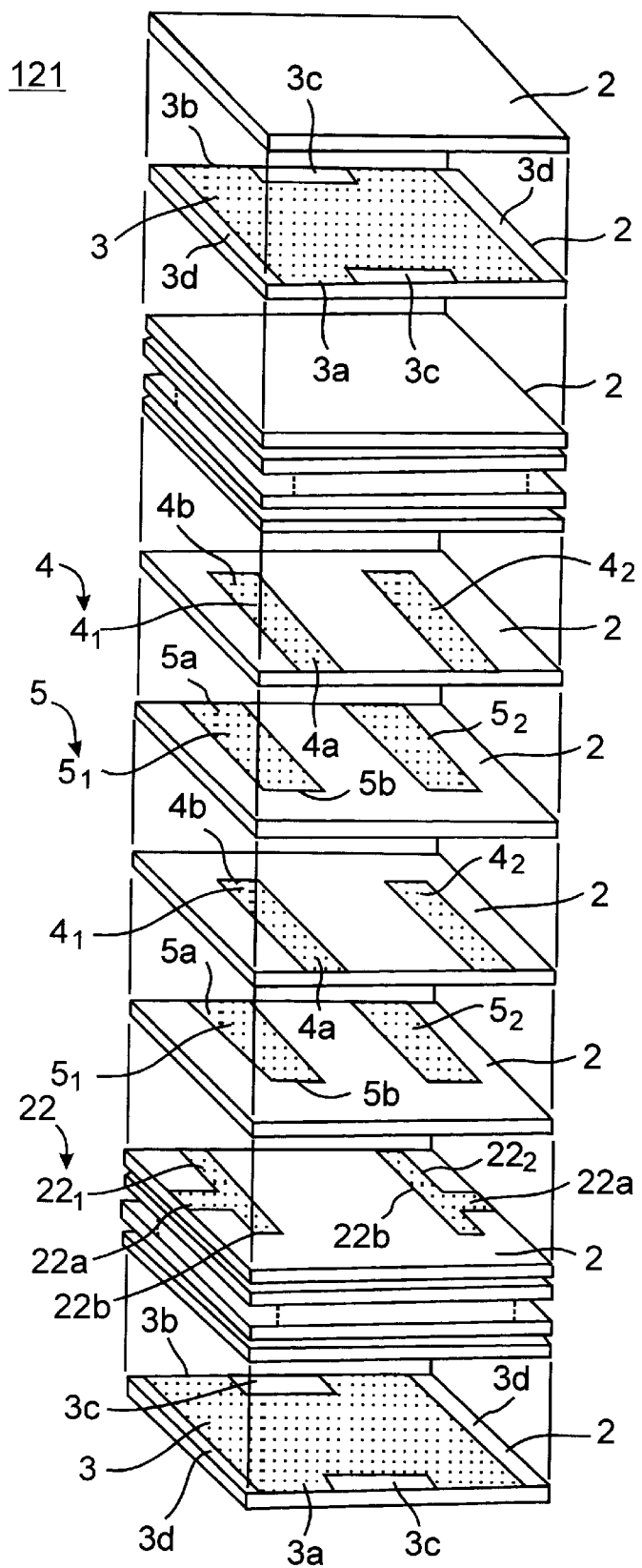
FIG. 21 is an exploded perspective view illustrating a second embodiment of the laminated band pass filter of the present invention.
Figure 22:
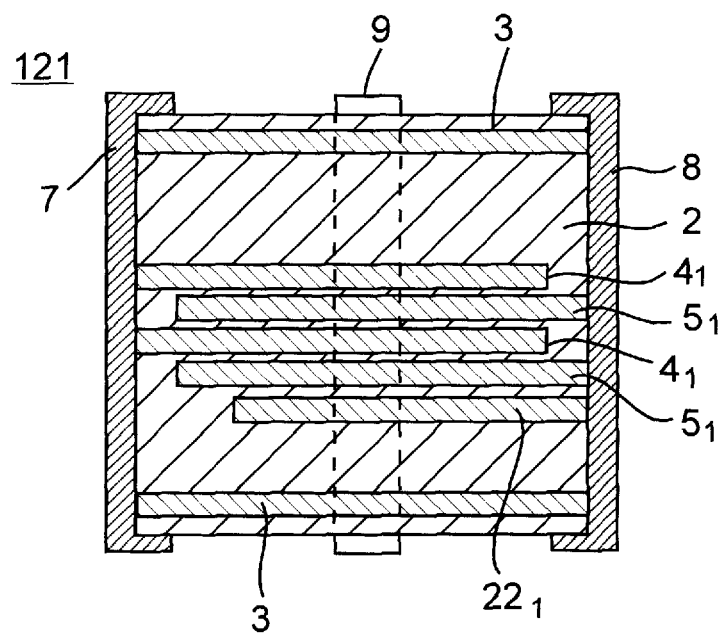
FIG. 22 is a sectional view of the laminated band pass filter shown in FIG. 21.

Second Embodiment (FIGS. 21 and 22)

As shown in FIG. 21, a laminated band pass filter 121 has the same construction as the band pass filter 101 of the foregoing first embodiment, except for an outgoing electrode 22 ($22_1$, $22_2$). The outgoing electrode $22_1$ is substantially T-shaped, and has an end portion 22a exposed on the left side of a dielectric sheet 2 and has another end portion 22b exposed on another side of the sheet 2. The other end portion 22b is coupled with an internal electrode $5_1$ by inductive coupling. Similarly, the outgoing electrode $22_2$ is designed having similar dimensions to the outgoing electrode $22_1$, having an end portion 22a exposed on the right side of the sheet 2, and another end portion 22b exposed on another side of the sheet 2. The other end portion 22b is coupled with the internal electrode $5_2$ by inductive coupling.

As shown in FIG. 22, the end portion 22a of the outgoing electrode $22_1$ is connected to an input/output external electrode 9, and the end portion 22b is connected to a grounding external electrode 8. On the other hand, the end portion 22a of the outgoing electrode $22_2$ is connected to the input/output electrode 10, and the end portion 22b is connected to the grounding external electrode 8. It is not, however, necessary to use a T-shaped outgoing electrode. For instance, the outgoing electrode can be L-shaped. It is also not necessary that the outgoing electrode be positioned close to the internal electrode 5. For instance, the outgoing electrode can be arranged in the vicinity of the internal electrode 4 or between the internal electrodes 4 and 5. The laminated band pass filter 121 having the construction as described above has similar functions as the band pass filter 101 of the above-mentioned first embodiment.

Figure 23:
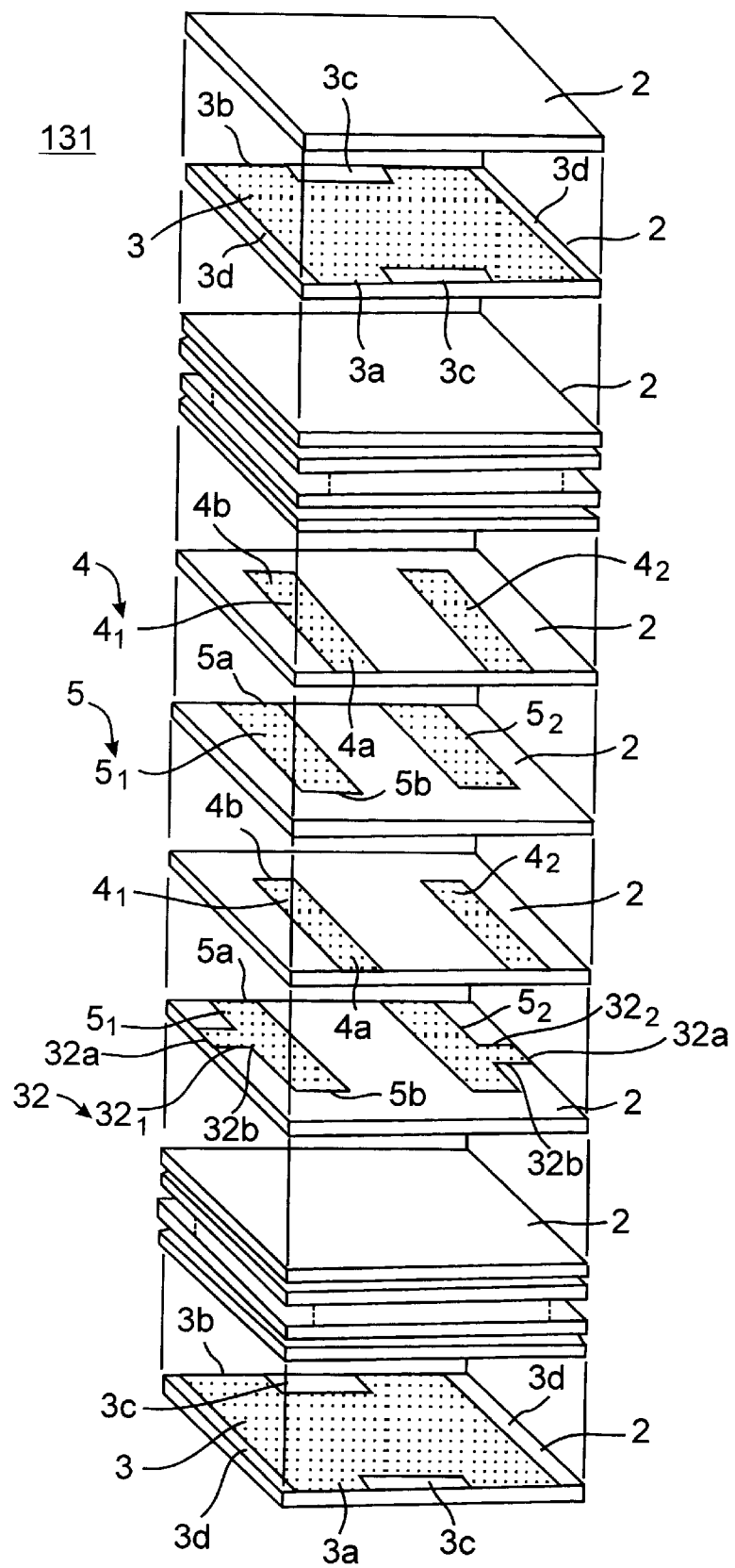
FIG. 23 is an exploded view illustrating a third embodiment of the laminated band pass filter of the present invention.
Figure 24:
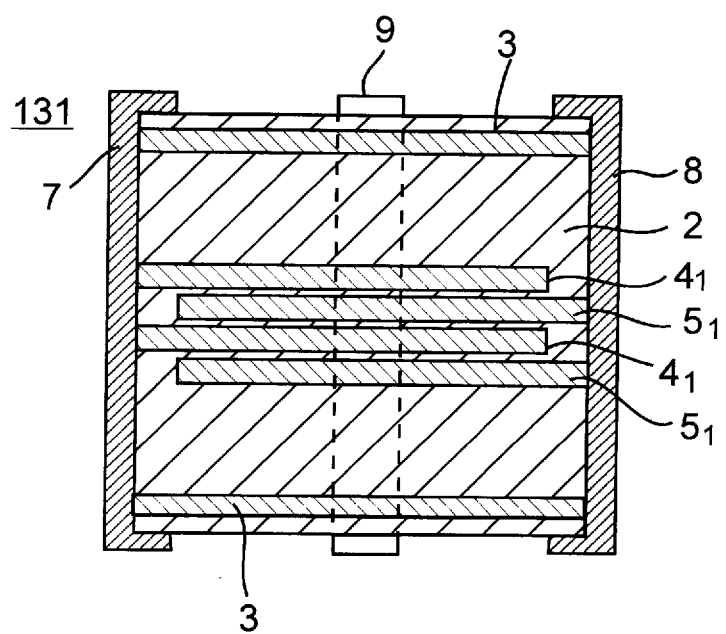
FIG. 24 is a sectional view of the laminated band pass filter shown in FIG. 23.

Third Embodiment (FIGS. 23 and 24)

As shown in FIGS. 23 and 24, a laminated band pass filter 131 has the same construction as that of the band pass filter 101 of the foregoing first embodiment, except for an outgoing electrode 32 ($32_1$, $32_2$). The outgoing electrode 32 is formed on a dielectric sheet 2 on which an internal electrode 5 is formed. The outgoing electrode $32_1$ is strip-shaped with a constant width, and has an end portion 32a exposed on the left side of the dielectric sheet 2, and has another end portion 32b connected to the internal electrode $5_1$ so as to form substantially a T shape. Therefore, the outgoing electrode $32_1$ is coupled directly to the internal electrode $5_1$. The end portion 32a is connected to an input/output external electrode 9. On the other hand, the outgoing electrode $32_2$ is designed to have similar dimensions to the outgoing electrode $32_1$, and has an end portion 32a exposed on the right side of the sheet 2, and has another end portion 32b connected to the internal electrode $5_2$. Therefore, the outgoing electrode $32_2$ is connected directly to the internal electrode $5_2$. The end portion 32a is connected to the input/output external electrode 10. It is not, however, necessary to connect the outgoing electrode to the internal electrode 5. Instead, it may be connected to the internal electrode 4. The laminated band pass filter 131 having the construction as described above has similar functions as the band pass filter 101 of the above-mentioned first embodiment.

Figure 25:
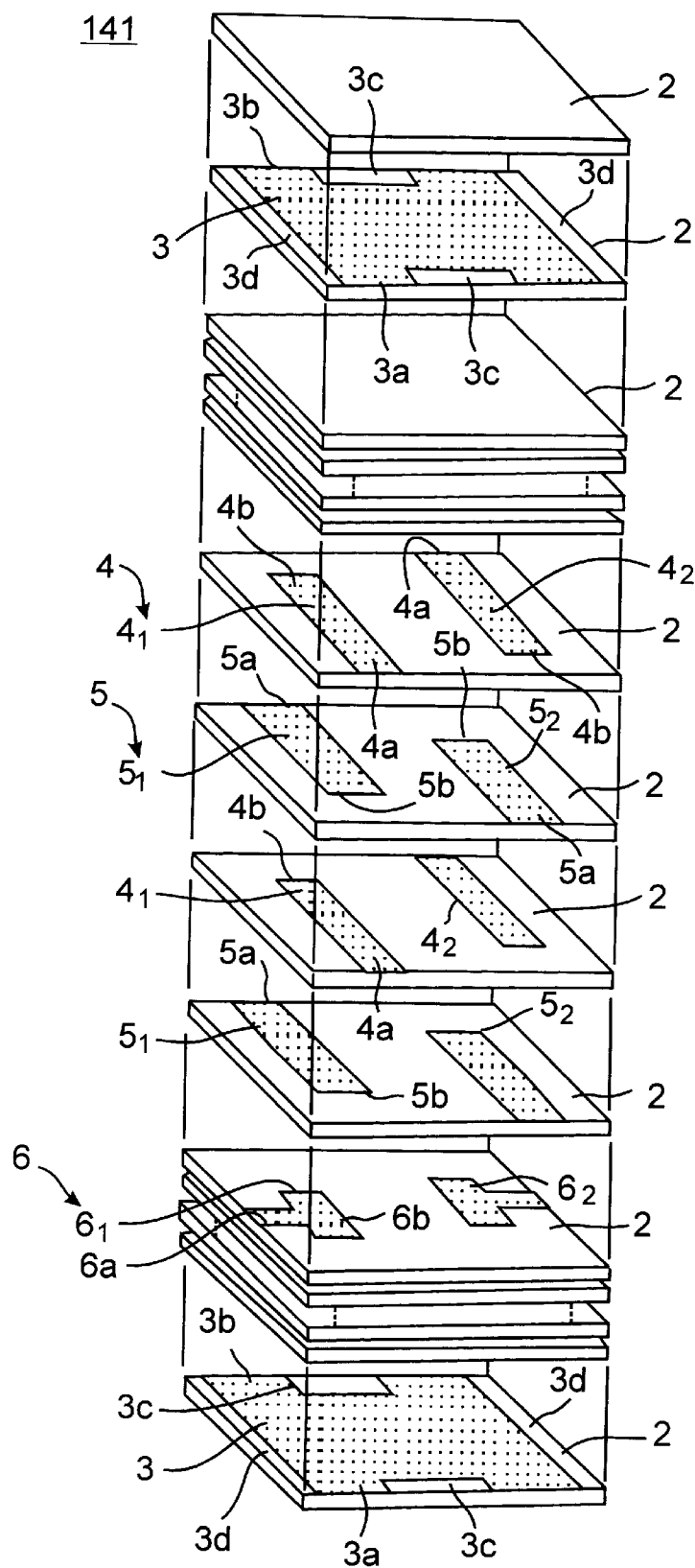
FIG. 25 is an exploded perspective view illustrating a fourth embodiment of the laminated band pass filter of the present invention.
Figure 26:
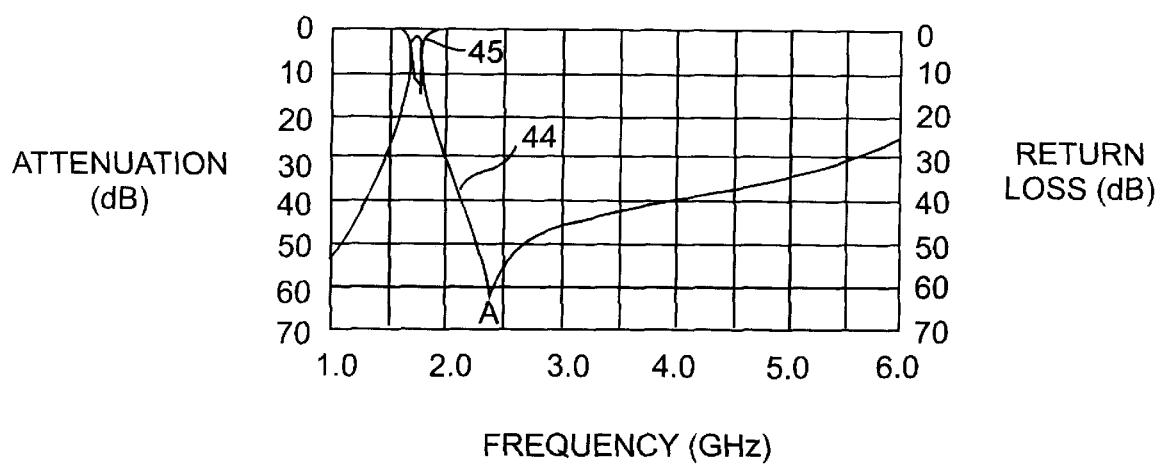
FIG. 26 is a graph illustrating damping and loss characteristics of the filter shown in FIG. 25.

Fourth Embodiment (FIGS. 25 and 26)

As shown in FIG. 25, a laminated band pass filter 141 has the same construction as that of the band pass filter 101 of the foregoing first embodiment, except for internal electrodes $4_2$ and $5_2$. The internal electrode $4_2$ has an end portion 4a exposed on one side of the sheet 2.

The internal electrodes $4_1$ and $4_2$ are formed on the same sheet surface 2, but the electrodes extend to opposite sides thereof. The internal electrodes $5_1$ and $5_2$ are formed on another sheet surface 2 in a similar manner. However, the pairs of electrodes ($4_1$ and $5_1$) and ($4_2$ and $5_2$) extend to opposite sides of their respective surfaces 2.

In a lamination formed by laminating the sheets 2, therefore, the internal electrode $5_1$ capacitance-coupled to an outgoing electrode $6_1$ (the internal electrode $5_1$ arranged in the lower portion in FIG. 25) extends to and is exposed on one side of the lamination. On the other hand, the internal electrode $5_2$ capacitance-coupled to an outgoing electrode $6_2$ (the internal electrode $5_2$ arranged in the lower portion in FIG. 25) extends to and is exposed on the opposite side of the lamination. The end portion 4a of the internal electrode $4_2$ is connected to a grounding external electrode 8 formed on one side of the lamination, and the end portion 5a of the internal electrode $5_2$ is connected to a grounding external electrode 7 formed on the opposite side of the lamination.

FIG. 26 is a graph illustrating damping characteristics (solid line 44) and reflection characteristics (solid line 45) of the thus obtained band pass filter 141. The damping characteristics are such that a pole is produced (at the position shown by A in FIG. 26) on the higher-frequency side relative to the central frequency of the filter 141. The band pass filter 141 therefore has similar functions to those of the band pass filter 101 of the foregoing first embodiment, with improved damping characteristics.

Figure 27:
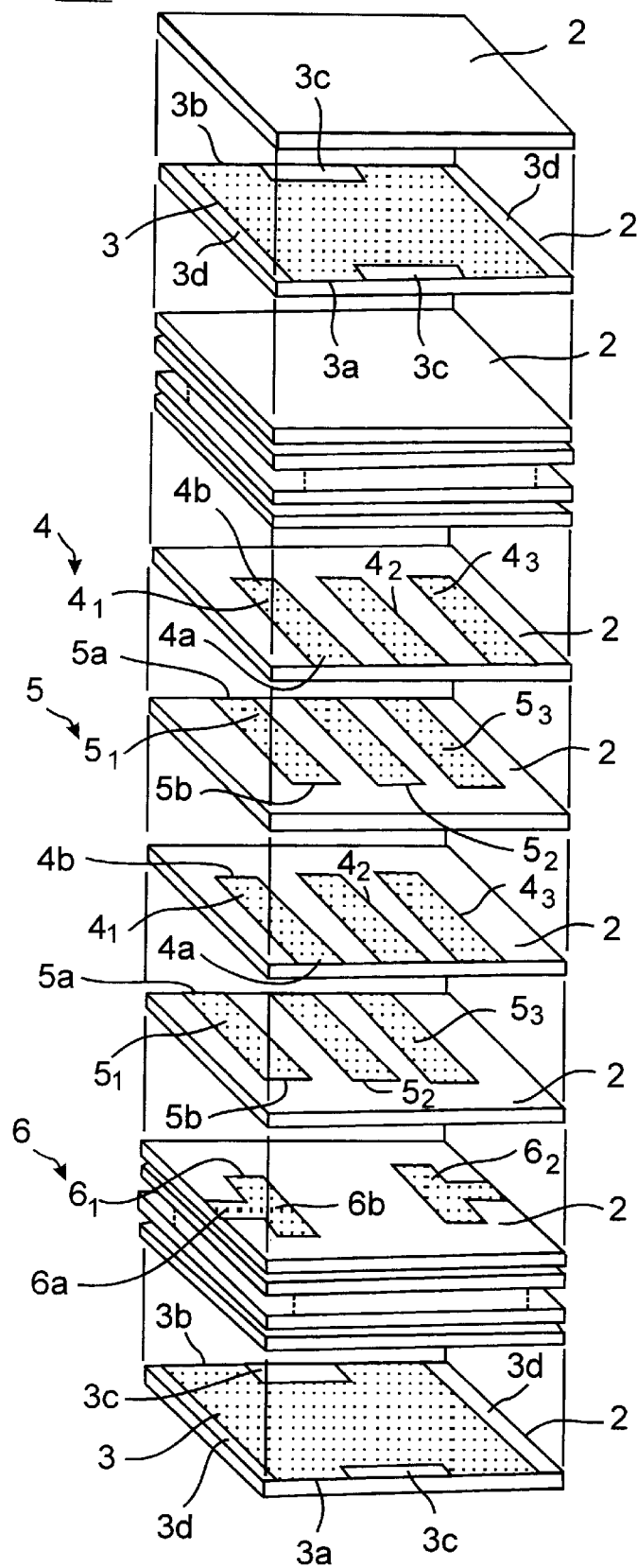
FIG. 27 is an exploded perspective view illustrating a fifth embodiment of the laminated band pass filter of the present invention.

Fifth Embodiment (FIG. 27)

As shown in FIG. 27, a laminated band pass filter 151 comprises three resonators formed by arranging internal electrodes 4 ($4_1$, $4_2$, $4_3$) and 5 ($5_1$, $5_2$, $5_3$) in parallel with respective dielectric sheets 2.

The internal electrode 4 has an end portion 4a exposed on the one side of the sheet 2. The internal electrode 5 opposite to this internal electrode 4, has an end portion 5a exposed on the opposite side of the sheet 2. The internal electrodes $4_1$ and $5_1$ are arranged at positions toward the left of the sheet 2, the internal electrodes $4_2$ and $5_2$ at the center of the sheet 2, and the internal electrodes $4_3$ and $5_3$, toward the right of the sheet 2. Outgoing electrodes $6_1$ and $6_2$ are capacitance-coupled to the internal electrodes $5_1$ and $5_3$, respectively.

After piling, the sheets 2 are integrally sintered into a lamination. In addition, grounding external electrodes 7 and 8 are formed on opposite sides of the lamination, and input/output external electrodes 9 and 10 are formed on the left and the right sides thereof (see FIG. 18). The end portion 4a of the internal electrode 4 and the end portion 3a of the shielded electrode 3 are connected to the grounding external electrode 7, and the end portion 5a of the internal electrode 5 and the end portion 3b of the shielded electrode 3 are connected to the grounding electrode 8. The end portion 6a of the outgoing electrode $6_1$ is connected to the input/output external electrode 9, and the end portion 6a of the outgoing electrode $6_2$ is connected to the input/output external electrode 10.

In the resultant band pass filter 151, capacitance produced between the internal electrodes $4_1$ and $5_1$ and inductance possessed by the internal electrode $4_1$ and $5_1$ are combined, thereby forming a distribution constant resonator. Similarly, the internal electrodes $4_2$ and $5_2$ and the internal electrodes $4_3$ and $5_3$ form distribution constant resonators, respectively. The thus formed three resonators are coupled by inductive coupling and capacitance coupling to form a filter known as a three-stage band pass filter. The damping characteristics of this band pass filter 151 are represented by the broken line 17 in FIG. 20. This band pass filter 151, which does not use a conventional strip conductor, can be manufactured as a compact product with a low resistance component. This embodiment therefore provides a compact three-stage band pass filter with a low loss by arranging the internal electrodes 4 and 5 in parallel.

Figure 28:
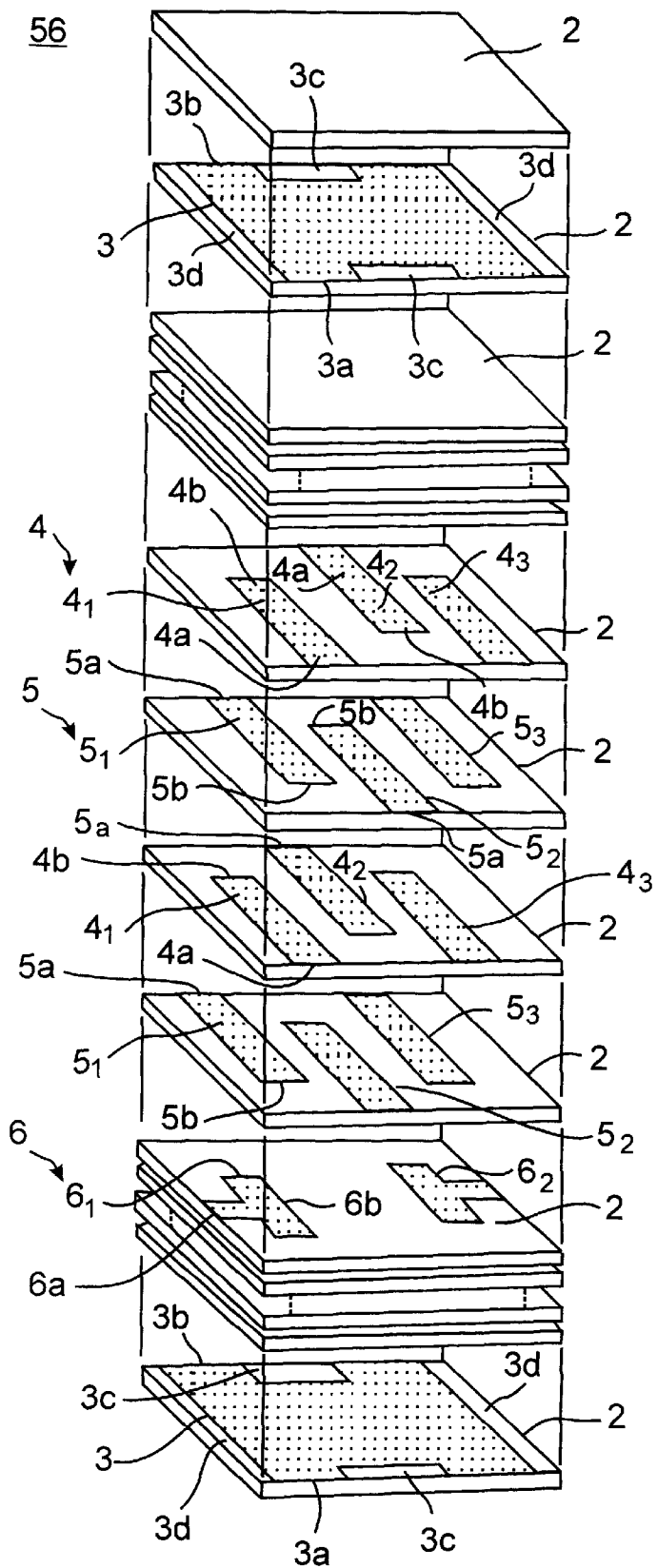
FIG. 28 is an exploded perspective view illustrating a sixth embodiment of the laminated band pass filter of the present invention.

Sixth Embodiment (FIG. 28)

As shown in FIG. 28, a laminated band pass filter 56 has the same construction as that of the band pass filter 151 of the foregoing fifth embodiment, except for internal electrodes $4_2$ and $5_2$. The internal electrode $4_2$ has an end portion 4a exposed on one side of a sheet 2. The internal electrodes $4_1$ and $4_3$ are formed on the same sheet 2 surface as electrode $4_2$, but extend to the opposite side of the sheet 2.

The end portion 5a of the internal electrode $5_2$ is partially exposed on the same side of the sheet 2 as electrodes $4_1$ and $4_3$. The internal electrodes $5_1$ and $5_3$, on the other hand, extend to the opposite side of the sheet 2.

In a lamination formed by laminating these sheets 2, therefore, the internal electrodes $5_1$ and $5_3$ (the internal electrodes $5_1$ and $5_3$ arranged in the lower portion in FIG. 12) are capacitive-coupled to outgoing electrodes $6_1$ and $6_2$ and extend to one side of the lamination. An end portion 4a of the internal electrode $4_2$ is connected to a grounding external electrode 8 formed on one side of the lamination, and an end portion 5a of the internal electrode $5_2$ is connected to a grounding external electrode 7 formed on the opposite side of the lamination.

The thus obtained band pass filter 56 has damping characteristic as represented by the broken line 17 in FIG. 20 such that a pole is formed on the higher-frequency side relative to the central frequency of the filter 56. The band pass filter 56 has therefore similar functions to the band pass filter 151 of the foregoing fifth embodiment.

Figure 29:
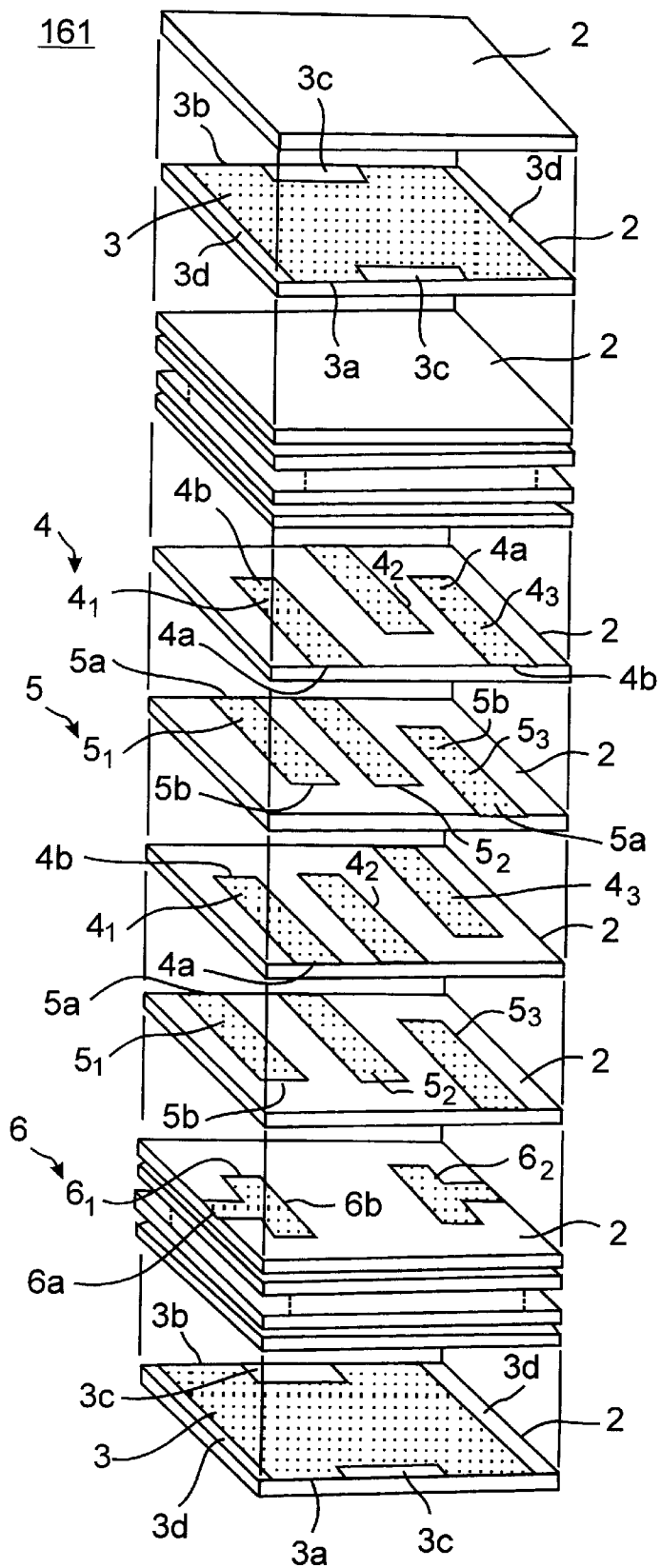
FIG. 29 is an exploded perspective view illustrating a seventh embodiment of the laminated band pass filter of the present invention.
Figure 30:
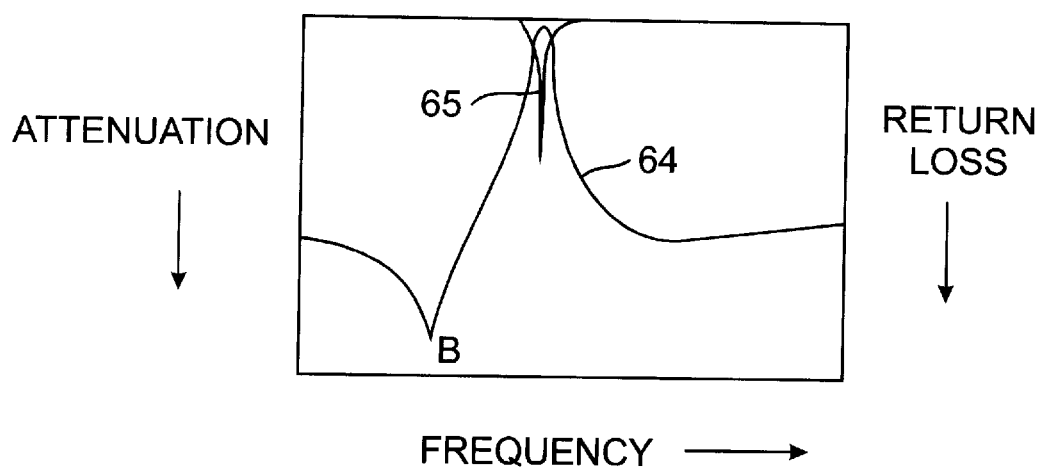
FIG. 30 is a graph illustrating damping and loss characteristics of the filter shown in FIG. 29.

Seventh Embodiment (FIGS. 29 and 30)

As shown in FIG. 29, a laminated band pass filter 161 has the same construction as that of the band pass filter 151 of the foregoing fifth embodiment, except for internal electrodes $4_3$ and $5_3$. The internal electrode $4_3$ has an end portion 4a exposed on one side of the sheet 2. The internal electrodes $4_1$ and $4_2$ formed on the same sheet 2 surface extend to the opposite side of the sheet 2. On the other hand, the internal electrode $5_3$ has an end portion 5a exposed on the same side of the sheet 2 as electrodes $4_1$ and $4_2$. The internal electrodes $5_1$ and $5_2$ formed on the same sheet 2 surface extend to the opposite side of the sheet 2 as electrode $5_3$.

In a lamination formed by laminating these sheets 2, therefore, the internal electrode $5_1$ (the internal electrode $5_1$ arranged in the lower portion in FIG. 29) is capacitive-coupled with an outgoing electrode $6_1$ and extends to and is exposed on one side of the lamination. On the other hand, the internal electrode $5_3$ (the internal electrode $5_3$ arranged in the lower portion in FIG. 29) is capacitive-coupled with an outgoing electrode $6_2$ and extends to and is exposed on the opposite side of the lamination. The end portion 4a of the internal electrode $4_3$ is connected to a grounding external electrode 8 formed on one side of the lamination, and the end portion 5a of the internal electrode $5_3$ is connected to a grounding external electrode 7 formed on the opposite side of the lamination.

FIG. 30 is a graph illustrating damping characteristics (solid line 64) and reflection characteristics (solid line 65) of the resultant band pass filter 161. A pole is produced on the lower-frequency side relative to the central frequency of the filter 161 (at the position shown by B in FIG. 30).

Figure 31:
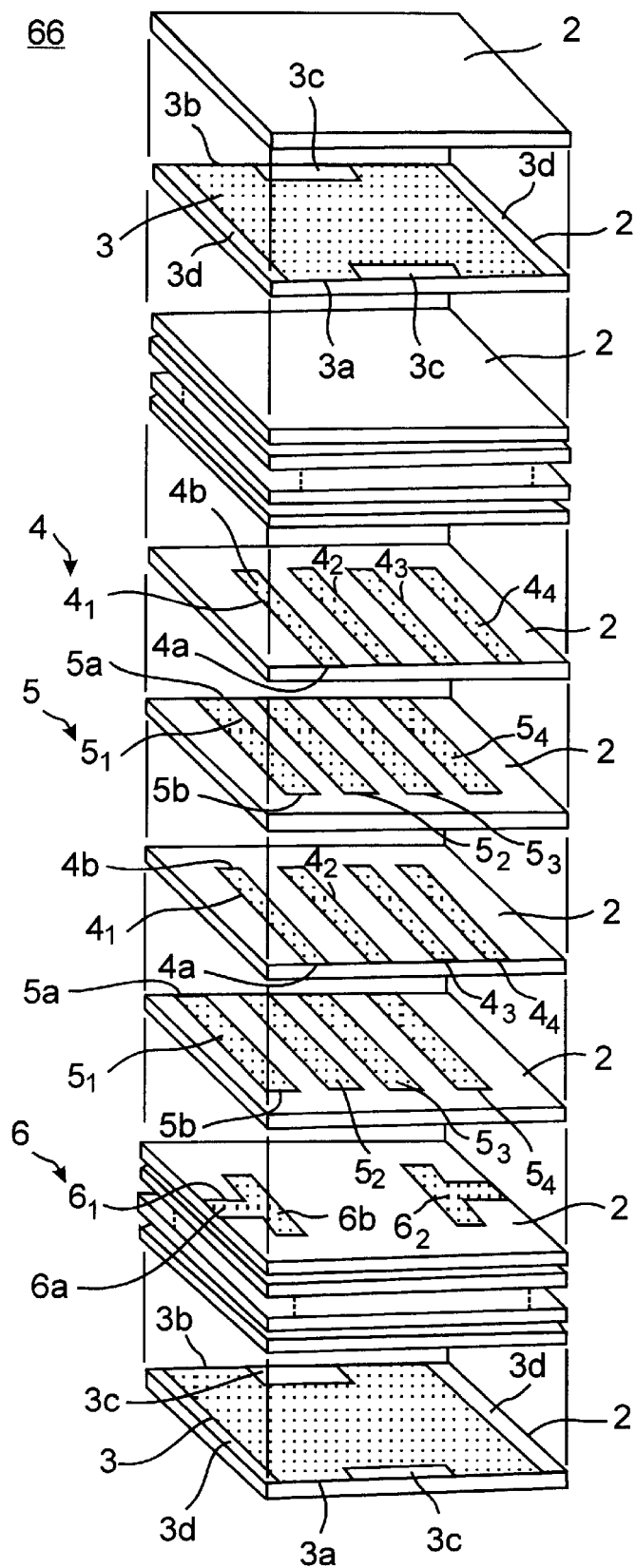
FIG. 31 is an exploded perspective view illustrating an eighth embodiment of the laminated band pass filter of the present invention.
Figure 32:
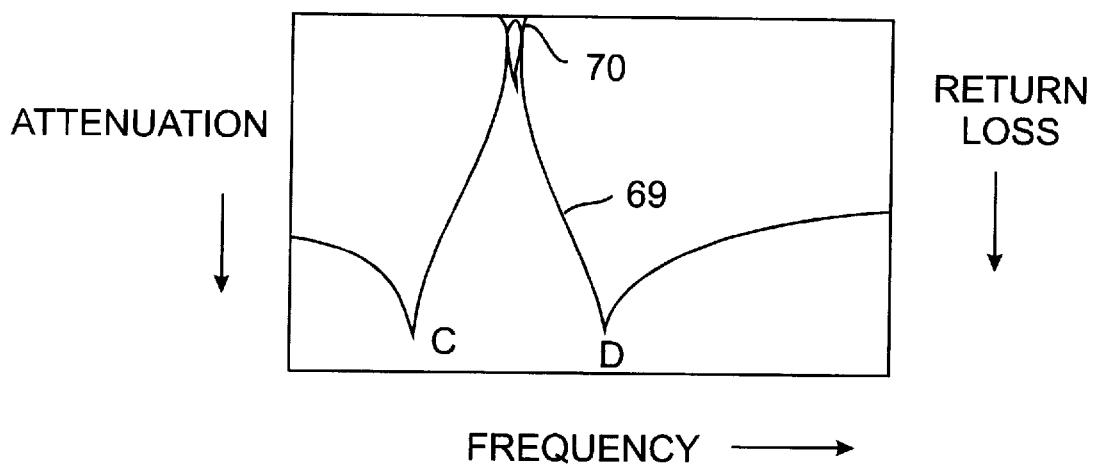
FIG. 32 is a graph illustrating damping and loss characteristics of the filter shown in FIG. 31.

Eighth Embodiment (FIGS. 31 and 32)

As shown in FIG. 31, a laminated band pass filter 66 comprises four resonators formed by arranging internal electrodes 4 ($4_1$, $4_2$, $4_3$, $4_4$) and 5 ($5_1$, $5_2$, $5_3$, $5_4$) in parallel on the surface of dielectric sheets 2, respectively.

The internal electrode 4 has an end portion 4a exposed on one side of the sheet 2, and the internal electrode 5 opposed to this internal electrode 4 has an end portion 5a exposed on the opposite side of the sheet 2. Outgoing electrodes $6_1$ and $6_2$ are capacitance-coupled with the internal electrodes $5_1$ and $5_4$, respectively.

After piling, these sheets 2 are integrally sintered into a lamination. In addition, as in the filter 101 of the foregoing first embodiment, grounding external electrodes 7 and 8 are formed on opposite sides of the lamination, respectively, and input/output external electrodes 9 and 10 are formed on the left and the right sides, respectively (see FIG. 18). The end portion 4a of the internal electrode 4 and the end portion 3a of the shielded electrode 3 are connected to the grounding external electrode 7, and the end portion 5a of the internal electrodes 5 and the end portion 3b of the shielded electrode 3 are connected to the grounding external electrode 8. The end portion 6a of the outgoing electrode $6_1$ is connected to the input/output electrode 9, and the end portion 6a of the outgoing electrode $6_2$ is connected to the input/output external electrode 10.

In the resultant band pass filter 66, capacitance produced between the internal electrodes $4_1$ and $5_1$ and inductance possessed by the internal electrodes $4_1$ and $5_1$ are combined to form distribution constant resonators. Similarly, distribution constant resonators are formed, one by the internal electrodes $4_2$ and $5_2$, one by the internal electrodes $4_3$ and $5_3$, and one by the internal electrodes $4_4$ and $5_4$. The thus formed four resonators are coupled by inductive coupling and capacitive coupling to form a filter known as a four-stage band pass filter. FIG. 32 is a graph illustrating damping characteristics (solid line 69) and reflection characteristics (solid line 70) of the band pass filter 66. The damping characteristics are such that a pole is produced on the high-frequency side and the low-frequency side (at the positions represented by C and D, respectively, in FIG. 32) with the central frequency of the filter 66 in between, with an excellent damping characteristic.

As a result, the band pass filter 66, which does not use a conventional strip conductor, can be manufactured into a compact product having a slight resistance component. It is therefore possible to easily obtain a compact four-stage band pass filter by arranging the internal electrodes 4 and 5 in parallel with a low loss.

Figure 33:
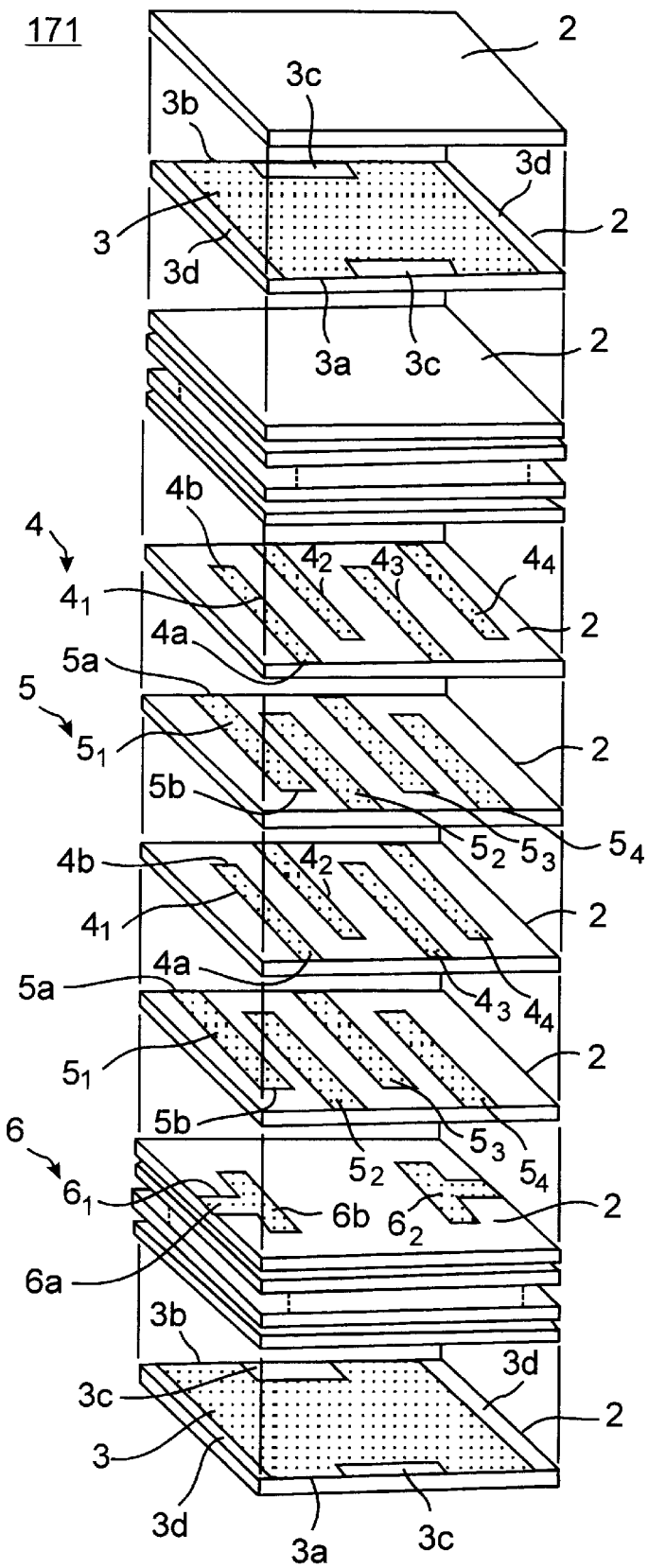
FIG. 33 is an exploded perspective view illustrating a ninth embodiment of the laminated band pass filter of the present invention.

Ninth Embodiment (FIG. 33)

As shown in FIG. 33, a laminated band pass filter 171 has the same construction as that of the band pass filter 66 of the foregoing eighth embodiment, except for internal electrodes $4_2$, $4_4$, $5_2$ and $5_4$. Each of the internal electrodes $4_2$ and $4_4$ have an end portion 4a exposed on one side of a sheet 2. The internal electrodes $4_1$ and $4_3$ are formed on the same sheet 2 surface, but extend to the opposite side of the sheet 2. Each of the internal electrodes $5_2$ and $5_4$ has an end portion 5a exposed on one side of the sheet 2. The internal electrodes $5_1$ and $5_3$ are formed on the same sheet 2, but extend to the opposite side of the sheet 2.

In a lamination formed by laminating these sheets 2, therefore, the internal electrode $5_1$ (the internal electrode $5_1$ arranged in the lower portion in FIG. 33) is capacitive-coupled with an outgoing electrode $6_1$, and extends to and is exposed on one side of the lamination. On the other hand, the internal electrode $5_4$ (the internal electrode $5_4$ arranged in the lower portion in FIG. 33) is capacitive-coupled with an outgoing electrode $6_2$, and extends to and is exposed on the opposite side of the lamination. The end portions 4a of the internal electrodes $4_2$ and $4_4$ are connected to a grounding electrode 8 formed on one side of the lamination, and the end portions 5a of the internal electrodes $5_2$ and $5_4$ are connected to a grounding electrode 7 formed on the opposite side of the lamination.

The resultant band pass filter 171 has damping and reflection characteristics similar to those shown in the graph of FIG. 32. The band pass filter 171 has similar functions to the band pass filter 66 of the foregoing eighth embodiment.

In this band pass filter 171, the internal electrodes formed on the sheets 2 extend alternately to opposite sides. This embodiment is not, however, limited to this specific configuration. For instance, every two internal electrodes may alternately extend; for example, $4_1$ and $4_2$ may extend to one side of the sheet 2, and $4_3$ and $4_4$ may extend to the opposite side.

Figure 34:
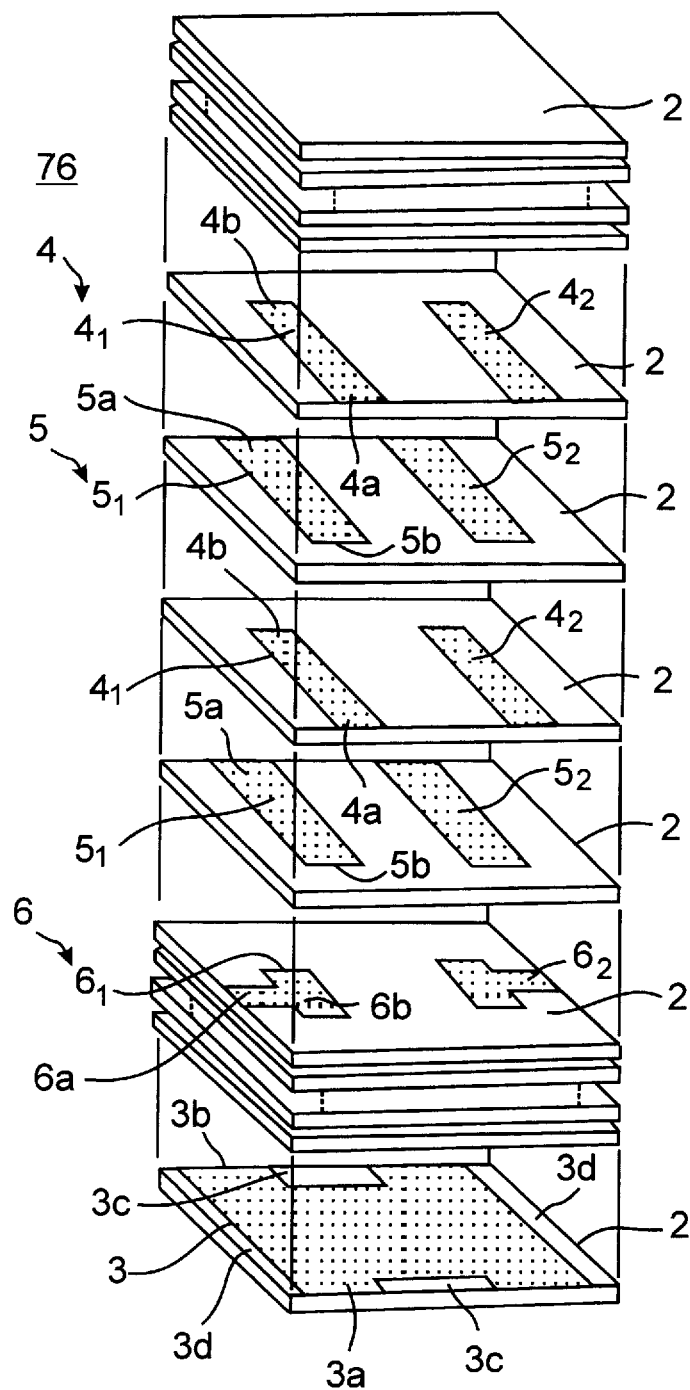
FIG. 34 is an exploded perspective view illustrating a tenth embodiment of the laminated band pass filter of the present invention.
Figure 35:
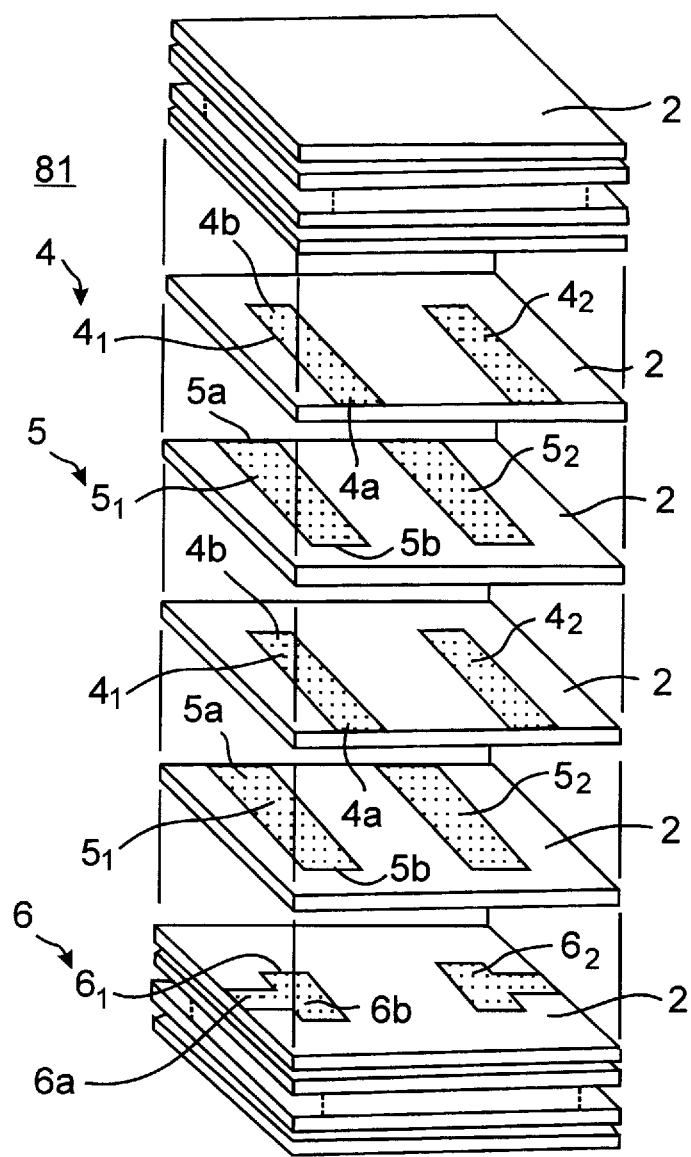
FIG. 35 is an exploded perspective view illustrating an eleventh embodiment of the laminated band pass filter of the present invention.

Tenth and Eleventh Embodiments (FIGS. 34 and 35)

As shown in FIG. 34, a laminated band pass filter 76 has the same construction as that of the band pass filter 101 of the foregoing first embodiment, but excludes the shielded electrode 3 arranged on the upper surface of the filter 101. As shown in FIG. 35, a laminated band pass filter 81 has the same construction as the band pass filter 101 of the foregoing first embodiment, but excludes all the shielded electrodes 3 of the filter 101. These band pass filters 76 and 81 have similar functions to those of the band pass filter 101 of the first embodiment, and further simplify the construction of the device by eliminating the shielded electrodes, thus leading to a lower manufacturing cost.

The band pass filter 76 or 81 can be shielded by covering it with a shielding metal case after mounting it onto a printed circuit board, or by mounting the filter 76 or 81 by soldering it onto a ground pattern for shielding having a wide area formed on a printed circuit board.

It will be apparent that the shielded electrode arrangements of the tenth and eleventh embodiments are also applicable to the other embodiments disclosed herein besides the first embodiment.

Figure 36:
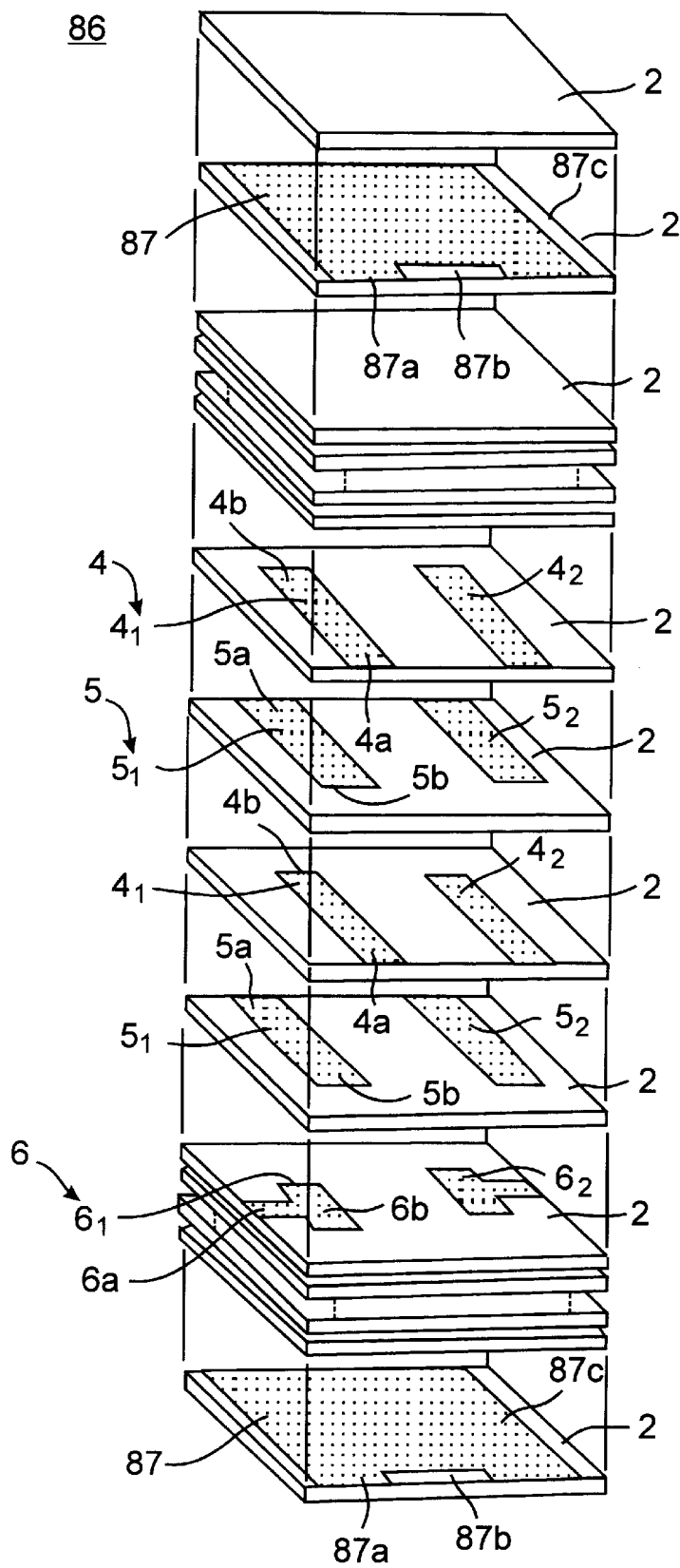
FIG. 36 is an exploded perspective view illustrating a twelfth embodiment of the laminated band pass filter of the present invention.
Figure 37:
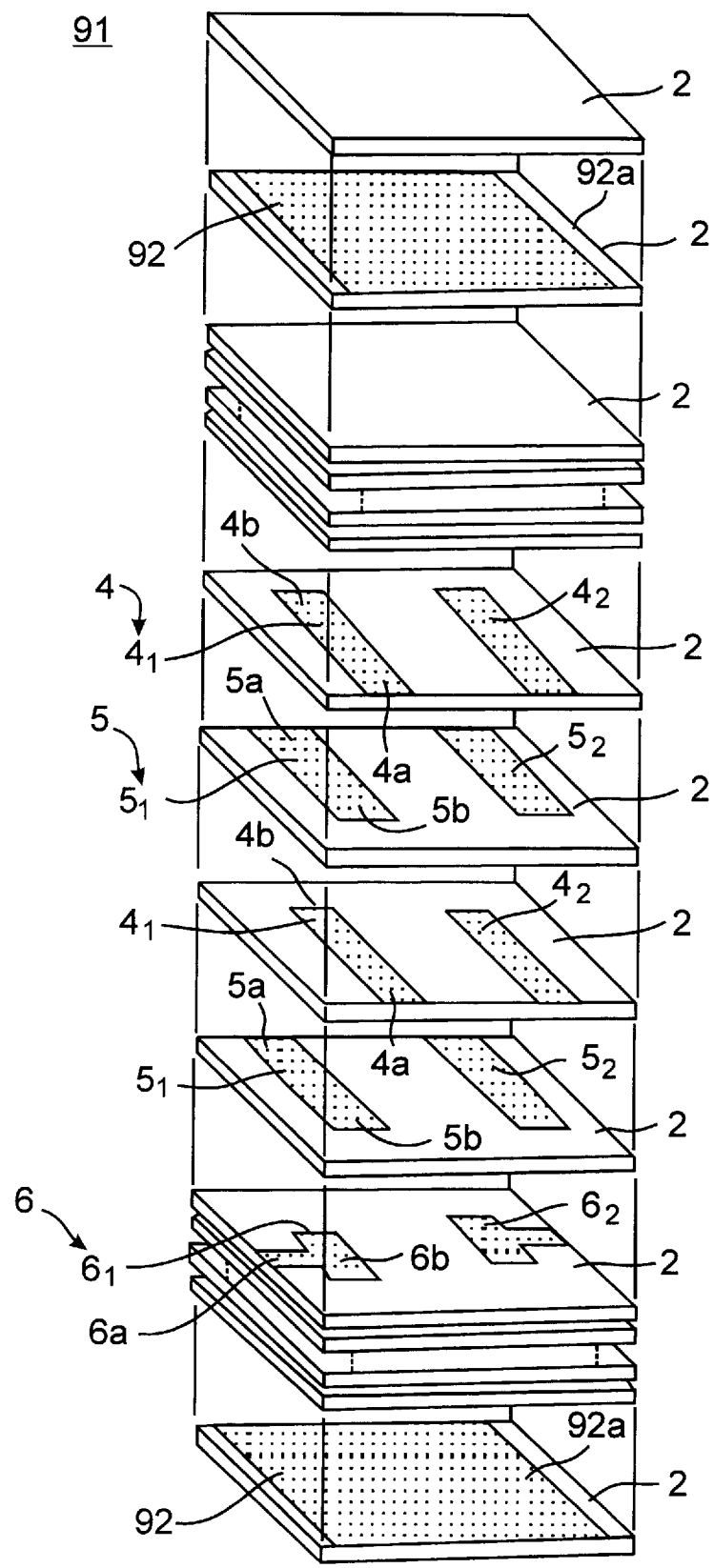
FIG. 37 is an exploded perspective view illustrating a thirteenth embodiment of the laminated band pass filter of the present invention.
Figure 38:
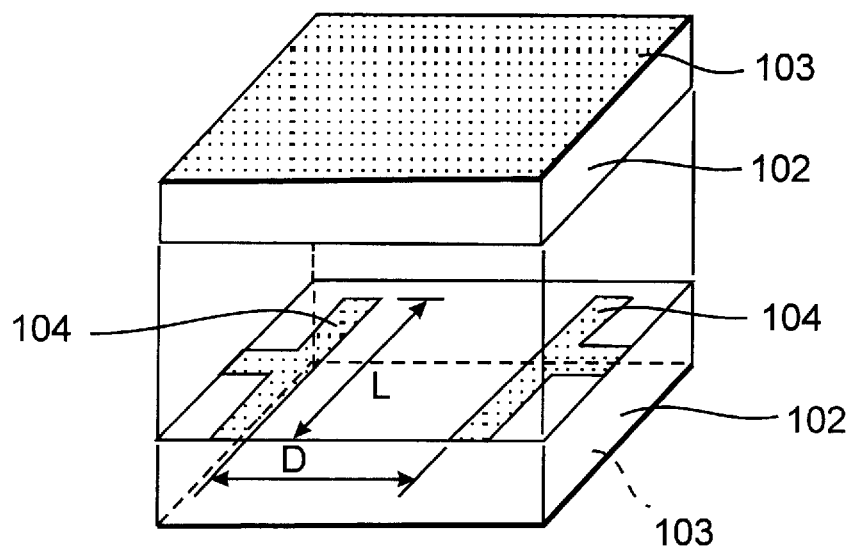
FIG. 38 is an exploded perspective view illustrating a conventional laminated band pass filter.

Twelfth and Thirteenth Embodiments (FIGS. 36 and 37)

As shown in FIG. 36, a laminated band pass filter 86 has the same construction as the band pass filter 101 of the foregoing first embodiment, except for a shielded electrode 87. The shielded electrode 87 is formed over substantially the entire surface of a dielectric sheet 2, and has an end portion 87a exposed on one side of the sheet 3. Bonding strength between the sheets 2 is improved by providing portions 87b and 87c which do not have a shielded electrode 87 formed thereon, on the outer periphery of the sheet 2. The shielded electrode 87 is connected only to a grounding external electrode 7.

As shown in FIG. 37, a laminated band pass filter 91 has the same construction as that of the band pass filter 101 of the foregoing first embodiment, except for a shielded electrode 92. The shielded electrode 92 is formed over substantially the entire surface of an dielectric sheet 2. Bonding strength between the sheets 2 is improved by providing a portion 92a not having the shielded electrode 92 on the outer periphery of the sheet 2. The shielded electrode 92 is not connected to any other electrode. The band pass filters 86 and 91 having the construction as described above have similar functions to the band pass filter 101 of the first embodiment, and furthermore improve bonding strength between sheets 2.

It will be apparent that the principles of the twelfth and thirteen embodiments also apply to other embodiments disclosed herein besides the first embodiment.

Other Embodiments

The laminated band pass filter of the present invention is not limited to the foregoing embodiments, but can be modified in various ways within the scope of the invention.

As in the foregoing embodiments, the number of internal electrodes within a resonator is not limited to four, but can comprise any number greater than at least two electrodes. With more internal electrodes, the central frequency of the band pass filter can be reduced. A flexible design is therefore possible, without scaling up the size of the band pass filter, from MHz range to GHz range by adjusting the number of internal electrodes. Hence, the band pass filter of the present invention is widely applicable, not only for communication equipment, but also for television equipment and the like. It is not necessary that the distance between internal electrodes be uniform. This distance can be changed in response to particular design requirements. Furthermore, five or more resonators can be provided.

It is not necessary to form an external electrode on a side of the lamination. It will be apparent that external electrodes can be provided on the surface and the back of the lamination through the use of electric connection techniques such as through-holes.

In the embodiments described above, sheets have been integrally sintered after piling, but this is not the only technique which can be used. A laminated band pass filter may be manufactured by, for example, the following method. The method comprises applying a dielectric pasty material by printing or the like, forming a dielectric film by drying, applying a conductive pasty material onto the surface of the resultant dielectric film and drying the film, thereby forming an electrode film. A band pass filter having a lamination structure is thus attainable by conducting lap coating. It is not necessary to use a dielectric material or ceramics for the sheet 2. For instance, a resin film or any other insulator can be used, or a previously sintered ceramic material can be used.

Electric coupling between the internal electrode and the outgoing electrode can be any combination of, for example, capacitance coupling and inductive coupling, or any combination of capacitance coupling, inductive coupling and direct coupling.

According to the present invention, as described above in detail, it is possible to form a distribution constant resonator with capacitance produced between internal electrodes as a main factor and by combining inductance possessed by the internal electrodes, by providing at least one oppositely arranged pair of internal electrodes and an outgoing electrode connected to at least one of the internal electrodes. A multi-stage band pass filter can be easily formed through inductive and capacitance coupling of a plurality of distribution constant resonators.

Since a conventional strip conductor is not used, it is possible to downsize the resonator, and a resonator having a low inductance component and a high Q-value is thus attainable. Similarly, because of the absence of a strip conductor, it is possible to downsize a band pass filter, and a low-loss band pass filter having a low resistance component is attainable. Because the dimensional tolerances are less strict for internal electrodes and the like, and the conventional method of manufacturing a laminated capacitor is applicable, manufacture is facilitated. It is possible to control the central frequency of a resonator or a band pass filter by adjusting the number of internal electrodes, thus making it possible to obtain a resonator or a band pass filter of any central frequency without scaling up the product.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A laminated resonator comprising:
 a plurality of internal electrodes arranged opposite to each other, forming a single resonating unit, wherein said plurality of internal electrodes generate a capacitance;
 an outgoing electrode electrically coupled with at least one of said internal electrodes;
 a lamination formed by at least an insulator, said internal electrodes and said outgoing electrode;
 a first external electrode, provided on a surface of said lamination, and connected to one of said internal electrodes;
 a second external electrode, provided on the surface of said lamination, and connected to another of said internal electrodes; and
 a third external electrode, provided on the surface of said lamination, and connected to at least said outgoing electrode.

2. A laminated resonator according to claim 1, wherein said third external electrode is an input/output external electrode.

3. A laminated resonator according to claim 1, wherein at least one of said first external electrode and said second external electrode is an external electrode for grounding.

4. A laminated resonator according to claim 1, wherein said electric coupling between said at least one of said internal electrodes and said outgoing electrode is one of capacitance coupling, inductive coupling and direct coupling, or combination thereof.

5. A laminated resonator according to claim 1, wherein said electric coupling between said at least one of said internal electrode and said outgoing electrode is capacitance coupling, and said outgoing electrode is arranged within a space formed between said internal electrodes.

6. A laminated resonator according to claim 1, wherein a shielded electrode is provided on at least one of an upper and a lower surfaces of said lamination.

7. A laminated resonator according to claim 6, wherein said shielded electrode is connected to at least one of said first external electrode and said second external electrode.

8. A laminated resonator according to claim 6, wherein said shielded electrode is not connected to any of the external electrodes.

9. A laminated resonator according to claim 6, wherein a distance between at least one of said internal electrodes and said shielded electrode is at least 300 $\mu$m or more.

10. A laminated resonator according to claim 1, wherein said electric coupling between said at least one of said internal electrode and said outgoing electrode is capacitance coupling, and said outgoing electrode is arranged outside said space formed between said internal electrodes.

11. The laminated resonator according to claim 1, wherein said plurality of internal electrodes of said resonating unit comprise at least three internal electrodes arranged opposite to each other.

12. A laminated band pass filter having at least two resonators, wherein:
each of said resonators has a plurality of internal electrodes arranged opposite to each other, forming a single resonating unit, wherein said plurality of internal electrodes generate a capacitance and an outgoing electrode electrically coupled with at least one of said internal electrodes;
wherein said band pass filter further has a first external electrode connected to at least one of the internal electrodes of said resonators, a second external electrode connected to at least one of the internal electrodes of said resonators, and a third and a fourth external electrodes connected to respective outgoing electrodes of said resonators, wherein said first, second, third and fourth electrodes are provided on a surface of a lamination formed by said internal electrodes, said outgoing electrodes and an insulator.

13. A laminated band pass filter according to claim 12, wherein, for each of said resonators, said electric coupling between said at least one of said internal electrodes and said outgoing electrode is one of capacitance coupling, inductive coupling and direct coupling, or combination thereof.

14. A laminated band pass filter according to claim 12, wherein, for each of said resonators, said electric coupling between said at least one of said internal electrodes and said outgoing electrode is capacitance coupling, and said outgoing electrode is arranged within a space formed between said internal electrodes.

15. A laminated band pass filter according to claim 12, wherein a shielded electrode is provided on at least one of an upper and a lower surfaces of said lamination.

16. A laminated band pass filter according to claim 15, wherein said shielded electrode is connected to at least one of said first external electrode and said second external electrode.

17. A laminated band pass filter according to claim 15, wherein said shielded electrode is not connected to any of the external electrodes.

18. A laminated band pass filter according to claim 15, wherein, for each of said resonators, a distance between at least one of said internal electrodes and said shielded electrode is at least 300 $\mu$m or more.

19. A laminated band pass filter according to claim 12, wherein said first external electrode and said second external electrode are formed on opposite sides of said lamination, and wherein, for each of said resonators, said internal electrodes extend to said respective opposite surfaces, and are connected to said first and second external electrodes, respectively.

20. A laminated band pass filter according to claim 12, wherein said third and said fourth external electrodes comprise input/output external electrodes.

21. A laminated band pass filter according to claim 12, wherein at least one of said first external electrode and said second external electrode is an external electrode for grounding.

22. A laminated band pass filter according to claim 12, wherein, for each of said resonators, said electric coupling between said at least one of said internal electrodes and said outgoing electrode is capacitance coupling, and said outgoing electrode is arranged outside said space formed between said internal electrodes.

23. The laminated band pass filter according to claim 12, where said plurality of internal electrodes of at least one resonating unit comprises at least three internal electrodes arranged opposite to each other.

24. A laminated resonator comprising:
a lamination formed by at least an insulator, at least a first and a second opposing internal electrodes forming a single resonating unit, wherein said first and second internal electrodes generate a capacitance, and an outgoing electrode;
wherein said outgoing electrode is connected to at least one of said first or said second internal electrodes;
a first external electrode disposed on a first side of said lamination, and connected to at least said first internal electrode;
a second external electrode disposed on a second side of said lamination, and connected to at least said second internal electrode; and
a third external electrode disposed on a third side of said lamination, and connected to at least said outgoing electrode.

25. A laminated band pass filter, comprising:
a lamination comprising at least an insulator, a first and a second opposing internal electrodes forming a single resonating unit, wherein said first and second internal electrodes generate a capacitance, a third and a fourth opposing electrodes, and a first and a second outgoing electrodes;
wherein said first outgoing electrode is connected to at least one of said first or said second internal electrodes, and said second outgoing electrode is connected to at least one of said third or fourth internal electrodes;
a first external electrode disposed on a first side of said lamination, and connected to at least one of said first through fourth internal electrodes;
a second external electrode disposed on a second side of said lamination, and connected to at least one of said first through fourth internal electrodes;
a third external electrode disposed on a third side of said lamination, and connected to at least said first outgoing electrode; and
a fourth external electrode disposed on a fourth side of said lamination, and connected to at least said second outgoing electrode.

* * * * *